United States Patent [19]
Kitazono et al.

[11] Patent Number: 5,525,937
[45] Date of Patent: Jun. 11, 1996

[54] FREQUENCY CONVERSION CIRCUIT WITH UHF/VHF COMMON PLL BUFFER

[75] Inventors: Shinchi Kitazono; Fumio Ishikawa; Shinichi Tsutsumi; Naoyasu Gamou, all of Kanagawa, Japan

[73] Assignee: Sony Corporation, Tokyo, Japan

[21] Appl. No.: 169,498

[22] Filed: Dec. 20, 1993

[30] Foreign Application Priority Data

Dec. 28, 1992 [JP] Japan .................................. 4-362174
Dec. 28, 1992 [JP] Japan .................................. 4-362175
Dec. 28, 1992 [JP] Japan .................................. 4-362176

[51] Int. Cl.$^6$ .............................. H03B 5/12; H04B 1/26; H04N 5/50
[52] U.S. Cl. .................... 331/49; 331/46; 331/117 R; 331/108 C; 455/190.1; 455/180.2; 455/191.1; 348/725; 348/731
[58] Field of Search .............................. 455/190.1, 180.1, 455/180.2, 188.1, 188.2, 189.1, 191.3, 318, 319, 320, 323, 333, 191.1; 348/731, 725; 331/49, 117 R, 108 C, 167, 177 V, 36 C, 108 D

[56] References Cited

U.S. PATENT DOCUMENTS

| | | | |
|---|---|---|---|
| 4,322,856 | 3/1982 | Ohta et al. | 455/333 |
| 4,621,241 | 11/1986 | Kiser | 331/117 R |
| 4,723,110 | 2/1988 | Voorman | 330/252 |
| 4,731,592 | 3/1988 | Sato et al. | 331/108 C |
| 4,912,520 | 3/1990 | Yamamoto et al. | 455/333 |
| 5,115,317 | 5/1992 | Igarashi et al. | 455/190.1 X |

FOREIGN PATENT DOCUMENTS 0130867  5/1990  Japan .................................. 331/108 C

OTHER PUBLICATIONS

WAM 2.4: A 470MHz 5V CATV Turner, Chikara Yamada, Yoshio Ueki, Mitsuru Itoh, Akira Satoh, Kohichi Ohya; Sony Corp.; Kanagawa, Japan; Session II: Consumer ICs; ISSCC 85/ Wednesday, Feb. 13, 1985/West Ballroom.

*Primary Examiner*—Robert Pascal
*Assistant Examiner*—Arnold Kinkead
*Attorney, Agent, or Firm*—Ronald P. Kananen

[57] ABSTRACT

An integrated oscillation circuit used for frequency conversion circuit in which UHF frequency conversion and VHF frequency conversion are selectively energized to use a common IF amplifier. The integrated oscillation circuit is used for a local oscillation circuit. The integrated oscillation circuit including a connection terminal connected to an external resonance circuit and an input line of a mode switching signal which is set at a different level in response to an operation mode, an oscillation element, a bias terminal of which is connected to the connection terminal, a detection circuit detecting the level of the mode switching signal applied to the bias terminal of the oscillation element, and a switching circuit turning on and off a power source for driving the oscillation element in response to the level detected at the detection circuit.

7 Claims, 10 Drawing Sheets

FREQUENCY CONVERSION CIRCUIT WITH UHF/VHF COMMON PLL BUFFER

BACKGROUND OF THE INVENTION

1. Field of the Invention

The present invention relates to an oscillator and a mixer applied to a television tuner performing wide band reception etc.

2. Description of the Related Art

First, an explanation will be made of a related art referring to the drawings.

FIG. 1 is a system block diagram of a usual television tuner circuit for UHF/VHF.

In FIG. 1, ANT denotes a UHF/VHF antenna; $STC_U$ a UHF single-tuned circuit; $STC_{VH}$ a VHF "High" single-tuned circuit; $STC_{VL}$ a VHF "Low" single-tuned circuit; $AMP_U$ a UHF RF amplifier; $AMP_V$ a VHF RF amplifier; $DTC_U$ a UHF double-tuned circuit; $DTC_{VH}$ and $DTC_{LH}$ VHF double-tuned circuits; and IC an integrated frequency conversion circuit.

In a VHF operation mode, where the VHF broadcast is received, the television signal received via the antenna ATN is input to single-tuned circuits $STC_{VH}$ and $STC_{VL}$. In the single-tuned circuits $STC_{VH}$ and $STC_{VL}$, the input television signal is tuned to the frequency of the desired channel and input to the RF amplifier $AMP_V$. The RF amplifier $AMP_V$ is constituted by for example a dual gate MOS FET (metal oxide semiconductor field effect transistor), the outputs of the single-tuned circuits $STC_{VH}$ and $STC_{VL}$ are output to one gate, an AGC voltage is input to the other gate, and the high frequency output is extracted. The high frequency output of the RF amplifier $AMP_V$ is subjected to a predetermined tuning function by the double-tuned circuits $DTC_{VH}$ and $DTC_{VL}$, and then input to the mixing circuit $MIX_V$ of the integrated frequency conversion circuit IC. In the mixing circuit $MIX_V$, mixing with the local oscillation frequency signal $S_{LV}$ by the local oscillation circuit $OSC_V$ having a frequency higher than the frequency of a video image carrier wave signal $RF_V$ of the selected channel by a predetermined frequency is carried out, so that an intermediate frequency signal $IF_V$ which is the frequency of a difference thereof is extracted. This is output to the IF amplifier $AMP_{IF}$ commonly used for UHF and VHF. In the IF amplifier $AMP_{IF}$, the predetermined amplification function is carried out, so that the IF output of VHF is obtained.

In a UHF operation mode, when a UHF broadcast is received, the television signal of the UHF band received via the antenna ATN is input to the single-tuned circuit $STC_U$. In the single-tuned circuit $STC_U$, the input television signal is tuned to the frequency of the desired channel and input to the RF amplifier $AMP_U$. The RF amplifier $AMP_U$ is constituted by for example the dual gate MOS FET. TO one gate is input the output of the single-tuned circuit $STC_U$, and to the other gate is input the AGC voltage, so that the high frequency output is extracted. The high level frequency output of the RF amplifier $AMP_V$ is subjected to the predetermined tuning function by the double-tuned circuit $DTC_U$, then input to the mixing circuit $MIX_U$ of the integrated frequency conversion circuit IC. In the mixing circuit $MIX_U$, mixing with the local oscillation frequency signal $S_{LU}$ by the local oscillation circuit $OSC_U$ having a frequency higher than the video image carrier wave frequency of the selected channel by a predetermined frequency is carried out, so that an intermediate frequency signal $IF_U$ which is the frequency of the difference thereof is extracted. This is output to the IF amplifier $AMP_{IF}$, commonly used for UHF and VHF. In the IF amplifier $AMP_{IF}$, the predetermined amplification function is carried out, so that the IF output of UHF is obtained.

The integrated frequency conversion circuit IC is constituted by a VHF circuit of a VHF local oscillation circuit $OSC_V$ and a mixing circuit $MIX_V$ thereof, a UHF circuit of a UHF local oscillation circuit $OSC_U$ and a mixing circuit $MIX_U$ thereof, and an IF amplifier $AMP_{IF}$ which amplifies an intermediate frequency signal $IF_V$ from the VHF mixing circuit $MIX_V$ and an intermediate frequency signal $IF_U$ from the UHF mixing circuit $MIX_U$.

In the integrated frequency conversion circuit IC in the above-mentioned tuning circuit, to achieve a reduction of consumption of electric power and simplify a circuit construction, the IF amplifier $AMP_{IF}$ is used in common, and therefore the VHF circuit of the VHF local oscillation circuit $OSC_V$ and the mixing circuit $MIX_V$, and the UHF circuit of the UHF local oscillation circuit $OSC_U$ and the mixing circuit $MIX_U$ are selectively operated in accordance with either the VHF or UHF mode. More specifically, a UHF/VHF mode changing signal (not shown) is input to the integrated frequency conversion circuit IC from an outside control system to drive a switching circuit (not shown), whereby current sources for driving the respective circuit in the UHF circuit or the respective circuit in the VHF circuit are turned ON or OFF.

An explanation will be made below of a concrete circuit structure of a general VHF local oscillation circuit $OSC_V$, UHF local oscillation circuit $OSC_U$, switching circuit, a VHF mixing circuit $MIX_V$, and a UHF mixing circuit $MIX_U$ in the integrated frequency conversion circuit IC with reference to FIG. 2 to FIG. 4.

FIG. 2 is a circuit diagram showing an example of the circuit configuration of a VHF local oscillation circuit $OSC_V$ and an output buffer thereof. $OSC_V$ denotes a VHF local oscillation circuit; RSN an external variable resonance circuit; and $BUF_V$ an output buffer, respectively.

The VHF local oscillation circuit $OSC_V$ and the output buffer $BUF_V$ are integrated. The VHF local oscillation circuit $OSC_V$ is connected via three input/output terminals $T_1$ to $T_3$, which are connection terminals for an external circuit etc., to the external variable resonance circuit $RSN_V$.

The VHF local oscillation circuit $OSC_V$ is constituted as a positive feedback differential amplifier type oscillation circuit, consisting of npn-type transistors $Q_1$ and $Q_2$ functioning as an oscillator, a constant voltage source $V_1$ for biasing the npn-type transistors $Q_1$ and $Q_2$, resistance elements $R_1$, $R_2$, and $R_3$, and a constant current source $I_1$.

The base of the oscillation transistor $Q_1$ is connected to the input/output terminal $T_1$, connected via the resistance element $R_1$ to the constant voltage source $V_1$, and further connected to the base of the npn-type transistor $Q_4$ of the output buffer $BUF_V$. The emitter of the oscillation transistor $Q_1$ is connected to the constant current source $I_1$, and another terminal of the constant current source $I_1$ is grounded. The collector of the oscillation transistor $Q_1$ is connected to a line feeding a power source voltage $V_{CC}$.

The base of the oscillation transistor $Q_2$ is connected to the input/output terminal $T_3$, connected via the resistance element $R_2$ to the constant voltage source $V_1$ and further connected to the base of the npn-type transistor $Q_3$ of the output buffer $BUF_V$. The emitter of the oscillation transistor $Q_2$ is connected to the constant current source $I_1$ and the collector thereof is connected to the input/output terminal $T_2$. Also, the resistance element $R_3$ is connected between the line of the power source voltage $V_{CC}$ and the collector of the oscillation transistor $Q_2$.

The external variable resonance circuit $RSN_1$ is constituted by a variable capacitance capacitor $CV_1$ and a coil $L_2$ which are connected in parallel. A connection point of one end of the coil $L_2$ of the external variable resonance circuit $RSN_1$ and one electrode of the variable capacitance capacitor $CV_1$ is grounded. A connection point of the other end of the coil $L_2$ and the other electrode of the variable capacitance capacitor $CV_1$ is connected via the capacitor $C_1$ and the input/output terminal $T_1$ to the base of the oscillation transistor $Q_1$, and connected via the capacitor $C_2$ and input/output terminal $T_2$ to the collector of the oscillation transistor $Q_2$. Also, one electrode of a capacitor $C_3$ is connected to an input/output terminal $T_3$, and the other electrode of the capacitor $C_3$ is grounded.

The VHF local oscillation circuit $OSC_V$ is subjected to a positive feedback of the externally attached capacitor $C_1$ connected via the input/output terminals $T_1$ and $T_2$ to the base of the oscillation transistor $Q_1$. It oscillates at the resonance frequency of the external variable resonance circuit $RSN_1$ and outputs the resonance signal to the output buffer $BUF_V$.

The output buffer $BUF_V$ is constituted by npn-type transistors $Q_3$ and $Q_4$, resistance elements $R_5$ to $R_7$ functioning as load resistor, resistance elements $R_8$ to $R_{11}$, and the constant current source $I_2$.

The base of the transistor $Q_3$ is connected to the base of the oscillation transistor $Q_2$ of the local oscillation circuit $OSC_V$ as mentioned above, the emitter is connected via the resistance elements $R_8$ and $R_9$, connected in series, to the constant current source $I_2$, and another terminal of the constant current source $I_2$ is grounded. The collector of the transistor $Q_3$ is connected via the series-connected load resistance elements $R_6$ and $R_5$ to the line of the power source voltage $V_{CC}$.

Note that, the output terminal $O_{UT1V}$ of the local oscillation circuit for VHF is constituted by the connection point of the resistance element $R_8$ and the resistance element $R_9$. This output terminal $O_{UT1V}$ is connected to the integrated VHF mixing circuit $MIX_V$ in FIG. 1.

The base of the transistor $Q_4$ is connected to the base of the oscillation transistor $Q_1$ of the local oscillation circuit $OSC_V$ as mentioned above, and the emitter is connected via series-connected resistance elements $R_{10}$ and $R_{11}$ to the constant current source $I_2$. The collector of the transistor $Q_4$ is connected via the load resistance element $R_7$ to the connection point of the series-connected load resistance elements $R_7$ and $R_5$.

Note that the output terminal $O_{UT2V}$ of the VHF local oscillation circuit $OSC_V$ is constituted by the connection point of the resistance element $R_{10}$ and the resistance element $R_{11}$. This output terminal $O_{UT2V}$ is connected to the integrated VHF mixing circuit $MIX_V$ in FIG. 1.

FIG. 3 is a circuit diagram showing one example of the configuration of the UHF local oscillation circuit $OSC_U$ and switching circuit. In FIG. 3, $OSC_U$ denotes a UHF local oscillation circuit; SW denotes a switching circuit; and an $RSN_2$ denotes an external variable resonance circuit, respectively.

The UHF local oscillation circuit $OSC_U$ and the switching circuit SW are integrated. The UHF local oscillation circuit $OSC_U$ is connected via four input/output terminals $T_5$ to $T_8$, which are connection terminals to an external circuit etc., to the external variable resonance circuit $RSN_2$.

Also, a UHF/VHF mode changing signal $S_{SW}$ is applied to the switching circuit SW via the switching terminal $T_4$ provided separately from the input/output terminals $T_5$ to $T_8$.

The UHF local oscillation circuit $OSC_U$ is constituted by a differential operation type Colpitz oscillation circuit, consisting of npn-type transistors $Q_7$ and $Q_8$ used for oscillation, a constant voltage source $V_2$ biasing the oscillation non-type transistors $Q_7$ and $Q_8$, resistance elements $R_{13}$ and $R_{14}$, resistance elements $R_{15}$ and $R_{16}$ functioning as load resistors of the oscillation npn-type transistors $Q_7$ and $Q_8$, and constant current sources $I_3$ and $I_4$.

The base of the oscillation transistor $Q_7$ is connected to the input/output terminal $T_5$ and, connected via the resistance element $R_{13}$ to the constant voltage source $V_2$. The emitter of the oscillation transistor $Q_1$ is connected to the input/output terminal $T_6$ and connected to the constant current source $I_3$, and the other terminal of the constant current source $I_3$ is grounded. The collector of the oscillation transistor $Q_7$ is connected via the load resistance element $R_{15}$ to the line of the power source voltage $V_{CC}$, and the output terminal $O_{UT1U}$ of the differential operation type Colpitz oscillation circuit is constituted by the connection point of the collector of the oscillation transistor $Q_7$ and the load resistance element $R_{15}$. This output terminal $O_{UT1U}$ is connected to the integrated mixing circuit $MIX_U$ in FIG. 1.

The base of the oscillation transistor $Q_8$, is connected to the input/output terminal $T_8$, and connected via the resistance element $R_{14}$ to the constant voltage source $V_2$. The emitter of the oscillation transistor $Q_8$ is connected to the input/output terminal $T_7$ and connected to the constant current source $I_4$, and the other terminal of the constant current source $I_4$ is grounded. The collector of the oscillation transistor $Q_8$, is connected via the load resistance element $R_{16}$ to the line of the power source voltage $V_{CC}$, and the output terminal $O_{UT2U}$ of the differential operation type Colpitz oscillation circuit is constituted by the connection point of the collector of the oscillation transistor $Q_8$, and the load resistance element $R_{16}$. This output terminal $O_{UT2U}$ is connected to the integrated mixing circuit $MIX_U$.

The external variable resonance circuit $RSN_2$ is constituted by connecting a capacitor $C_5$ in parallel to the serial circuit of a variable capacitance capacitor $CV_2$ and a coil $L_3$. The connection point of the coil $L_3$ of the external variable resonance circuit $RSN_2$ and the capacitor $C_5$ is connected via a DC cutting capacitor $C_6$ and the input/output terminal $T_5$ to the base of the oscillation transistor $Q_7$, and the connection point of an anode of the variable capacitance diode $CV_2$ and the capacitor $C_5$ is connected via the DC cutting capacitor $C_7$ and the input/output terminal $T_8$ to the base of the oscillation transistor $Q_8$.

Also, a positive feedback capacitor $C_8$ is connected between the connection point of the capacitor $C_6$ and input/output terminal $T_5$ and the input/output terminal $T_6$, and a positive feedback capacitor $C_9$, is connected between the connection point of the capacitor $C_7$ and input/output terminal $T_8$, and the input/output terminal $T_7$.

Further, a coupling capacitor $C_{10}$ is connected to the connection point of the capacitor $C_8$ and the input/output terminal $T_6$ and the connection point of the capacitor $C_9$ and the input/output terminal $T_7$, i.e., between the emitter of the oscillation transistor $C_5$ and the emitter of the oscillation transistor $Q_8$. The UHF local oscillation circuit $OSC_U$ is subjected to a positive feedback of the externally attached capacitors $C_8$ and $C_9$ connected to the base and emitter of the oscillation transistors $Q_7$ and $Q_8$ via the input/output terminals $T_5$, $T_6$, $T_7$, and $T_8$. It oscillates by the resonance frequency of the external variable resonance circuit $RSN_2$ connected to the respective bases of the oscillation transistors $Q_7$ and $Q_8$ and outputs a local oscillation frequency signal $S_{LU}$ having a predetermined frequency from the output terminals $O_{UT1U}$ and $O_{UT2U}$ to the UHF mixing circuit $MIX_U$.

Note that, the oscillation transistors $Q_7$ and $Q_8$ constituting the differential operation type Colpitz oscillation circuit are mutually connected at their respective bases via the external variable resonance circuit $RSN_2$ and therefore perform oscillation operations of out of phases. Accordingly, local oscillation frequency signals $S_{LU}$ having out of phases to each other are output from the output terminals $O_{UT1T}$ and $O_{UT2U}$.

The switching circuit SW is constituted by the switching operation npn-type transistors $Q_5$ and $Q_6$ and resistance elements $R_{18}$, $R_{19}$, and $R_{20}$.

The base of the switching transistor $Q_5$ is connected via the resistance element $R_{18}$ to the collector of the switching transistor $Q_6$, the emitter thereof is grounded, and the collector is connected to the not illustrated UHF system current source. The base of the switching transistor $Q_6$ is connected via the resistor $R_{20}$ to the switching terminal $T_4$, the emitter thereof is grounded, the connection point of the collector and the resistance element $R_{18}$ is connected via a high resistance element $R_{19}$ to the line of the power source voltage $V_{CC}$, and the connection point of the collector and the resistance element $R_{18}$ and the connection point with the high resistance element $R_{19}$ is connected to the not illustrated VHF system current source.

FIG. 4 is a circuit diagram showing an example of the circuit configuration of the VHF mixing circuit $MIX_V$ and the UHF mixing circuit $MIX_U$. These circuits are integrated.

The VHF mixing circuit $MIX_V$ is constituted by npn-type transistors $Q_{11}$ to $Q_{16}$, resistance elements $R_{21}$ to $R_{23}$, and constant current sources $I_6$ and $I_7$.

The base of the transistor $Q_{11}$ is connected to the output of the VHF local oscillation circuit $OSC_V$ and the base of the transistor $Q_{14}$. The emitter of the transistor $Q_{11}$ is connected to the emitter of the transistor $Q_{12}$ and the collector of the transistor $Q_{15}$. The collector of the transistor $Q_{11}$ is connected via the resistance element $R_{21}$ to the line of the power source voltage $V_{CC}$, and the connection point of the collector and the resistance element $R_{21}$ is connected to one input of the IF amplifier $AMP_{IF}$.

The base of the transistor $Q12_V$ is connected to the output of the VHF local oscillation circuit $OSC_V$ and the base of the transistor $Q_{13}$, and the collector is connected to the other input of the IF amplifier $AMP_{IF}$.

The emitter of the transistor $Q_{13}$ is connected to the emitter of the transistor $Q_{14}$ and the collector of the transistor $Q_{16}$. The collector of the transistor $Q_{13}$ is connected to the one input of the IF amplifier $AMP_{IF}$.

The collector of the transistor $Q_{14}$ is connected via the resistance element $R_{22}$ to the line of the power source voltage $V_{CC}$, while the connection point of the collector and the resistance element $R_{22}$ is connected to the other input of the IF amplifier $AMP_{IF}$.

The base of the transistor $Q_{15}$ is connected to the output of the double-tuned circuits $DTC_{VH}$ and $DTC_{VL}$ shown in FIG. 1, the emitter is connected to the constant current source $I_6$, and the constant current source $I_6$ is grounded.

The base of the transistor $Q_{16}$ is connected to the output of the double-tuned circuits $DTC_{VH}$ and $DTC_{VL}$ shown in FIG. 1, the emitter is connected to the constant current source $I_7$, and the constant current source $I_7$ is grounded.

Also, a resistance element $R_{23}$ is connected between the emitter of the transistor $Q_{15}$ and the emitter of the transistor $Q_{16}$. This VHF mixing circuit $MIX_V$ mixes the local oscillation frequency signal $S_{LV}$ by the local oscillation circuit $OSC_V$ having a frequency higher than the frequency of a video image carrier wave signal $RF_V$ of the selected channel by a predetermined frequency, for example, 58.75 MHz, extracts an intermediate frequency signal $IF_V$ which is the frequency of a difference thereof, and outputs the same to the IF amplifier $AMP_{IF}$, commonly used for UHF and VHF.

The UHF mixing circuit $MIX_U$ is constituted by npn-type transistors $Q_{18}$ to $Q_{24}$, resistance elements $R_{24}$ to $R_{26}$, and constant current sources $I_8$ and $I_9$.

The base of the transistor $Q_{18}$ is connected to the output of the UHF local oscillation circuit $OSC_U$ and the base of the transistor $Q_{22}$. The emitter of the transistor $Q_{18}$ is connected to the emitter of the transistor $Q_{19}$ and the collector of the transistor $Q_{23}$. The collector of the transistor $Q_{18}$ is connected via the resistance element $R_{24}$ to the line of the power source voltage $V_{CC}$, and the connection point of the collector and the resistance element $R_{24}$ is connected to one input of the IF amplifier $AMP_{IF}$.

The base of the transistor $Q_{19}$ is connected to the output of the UHF local oscillation circuit $OSC_U$ and the base of the transistor $Q_{21}$, and the collector is connected to the other input of the IF amplifier $AMP_{IF}$.

The emitter of the transistor $Q_{21}$ is connected to the emitter of the transistor $Q_{22}$ and the collector of the transistor $Q_{24}$. The collector of the transistor $Q_{21}$ is connected to one input of the IF amplifier $AMP_{IF}$.

The collector of the transistor $Q_{22}$ is connected via the resistance element $R_{25}$ to the line of the power source voltage $V_{CC}$, and the connection point of the collector and the resistance element $R_{25}$ is connected to the other input of the IF amplifier $AMP_{IF}$.

The base of the transistor $Q_{23}$ is connected to the output of the double-tuned circuit $DTC_U$ shown in FIG. 1, the emitter thereof is connected to the constant current source $I_8$, and the other terminal of the constant current source $I_8$ is grounded.

The base of the transistor $Q_{24}$ is connected to the output of the double-tuned circuit $DTC_U$ shown in FIG. 1, the emitter thereof is connected to the constant current source $I_9$, and other terminal of the constant current source $I_9$ is grounded.

Also, a resistance element $R_{26}$ is connected between the emitter of the transistor $Q_{23}$ and the emitter of the transistor $Q_{24}$. This UHF mixing circuit $MIX_U$ mixes the local oscillation frequency signal $S_{LU}$ by the local oscillation circuit $OSC_U$ having a frequency higher than the frequency of a video image carrier wave signal $RF_U$ of the selected channel by predetermined frequency, for example, 58.75 MHz, extracts an intermediate frequency signal $IF_U$ which is the frequency of a difference thereof, and outputs the same to the IF amplifier $AMP_{IF}$ commonly used for UHF and VHF.

In such a structure, at the VHF operation, the UHF/VHF mode changing signal $S_{SW}$ of a low level "0 V" is input to the switching terminal $T_4$ by for example the external control system. Alternatively, the switching terminal $T_4$ is opened. By this, the base potential of the switching transistor $Q_6$ becomes "0 V", and therefore the switching transistor $Q_6$ is retained to the OFF state. Accordingly, a current generated via the high resistance element $R_{19}$ is supplied to the current source for VHF. Along with this, a driving current is supplied to the VHF mixing circuit $MIX_V$ and local oscillation circuit $OSC_V$. Also, a current generated via the high resistance element $R_{19}$ is applied via the resistance element $R_{18}$, as the predetermined signal voltage to the base of the switching transistor $Q_5$. By this, the switching transistor $Q_5$ becomes the ON state, and the UHF system current source connected to the collector thereof is turned OFF. Accordingly, the driving current is not supplied to the UHF mixing circuit $MIX_U$ and local oscillation circuit $OSC_U$.

In such a VHF operation mode, where the VHF broadcast is received, the television signal received via the antenna ATN is input to single-tuned circuits $STC_{VH}$ and $STC_{VL}$. In the single-tuned circuits $STC_{VH}$ and $STC_{VL}$, the input television signal is tuned to the frequency of the desired channel and input to the RF amplifier $AMP_V$. The RF amplifier $AMP_V$ is constituted by for example a dual gate MOS FET, the outputs of the single-tuned circuits $STC_{VH}$ and $STC_{VL}$ are output to one gate, an AGC voltage is input to the other gate, and the high frequency output is extracted. The high frequency output of the RF amplifier $AMP_V$ is subjected to a predetermined tuning function by the double-tuned circuits $DTC_{VH}$ and $DTC_{VL}$, and then input to the mixing circuit $MIX_V$ of the integrated frequency conversion circuit IC. In the mixing circuit $MIX_V$, mixing with the local oscillation frequency signal $S_{LV}$ by the local oscillation circuit $OSC_V$ having a frequency higher than the frequency of a video image carrier wave signal $RF_V$ of the selected channel by a predetermined frequency is carried out, so that an intermediate frequency signal $IF_V$ which is the frequency of a difference thereof is extracted. This is output to the IF amplifier $AMP_{IF}$ commonly used for UHF and VHF. In the IF amplifier $AMP_{IF}$, the predetermined amplification function is carried out, so that the IF output of VHF is obtained.

Contrary to this, in a UHF operation, a UHF/VHF mode changing signal $S_{SW}$ of a high level "9 V" the same level as that of the power source voltage $V_{CC}$ is applied to the switching terminal $T_{SW}$ by for example the external control system. By this, the base potential of the switching transistor $Q_6$ becomes the high level, and therefore the switching transistor $Q_6$ is retained in the ON state. Accordingly, a current generated via the high resistance element $R_{19}$ flows through the switching transistor $Q_6$, not supplied to the VHF current source, and the collector side is held at "0 V" at the switching transistor $Q_6$. Along with this, the driving current is not supplied to the VHF mixing circuit $MIX_V$ and local oscillation circuit $OSC_V$. Also, the collector side of the switching transistor $Q_6$ is retained at "0 V", and therefore the base terminal of the switching transistor $Q_5$ becomes "0 V", whereby the switching transistor $Q_5$ is retained in the OFF state. By this, the UHF system current source connected to the collector of the switching transistor $Q_5$ becomes ON. Accordingly, the driving current is supplied to the UHF mixing circuit $MIX_U$ and local oscillation circuit $OSC_U$.

In such a UHF operation mode, when a UHF broadcast is received, the television signal of the UHF band received via the antenna ATN is input to the single-tuned circuit $STC_U$. In the single-tuned circuit $STC_U$, the input television signal is tuned to the frequency of the desired channel and input to the RF amplifier $AMP_U$. The RF amplifier $AMP_U$ is constituted by for example the dual gate MOS FET. To one gate is input the output of the single-tuned circuit $STC_U$, and to the other gate is input the AGC voltage, so that the high frequency output is extracted. The high level frequency output of the RF amplifier $AMP_V$ is subjected to the predetermined tuning function by the double-tuned circuit $DTC_U$, then input to the mixing circuit $MIX_U$ of the integrated frequency conversion circuit IC. In the mixing circuit $MIX_U$, mixing with the local oscillation frequency signal $S_{LU}$ by the local oscillation circuit $OSC_U$ having a frequency higher than the video image carrier wave frequency of the selected channel by a predetermined frequency is carried out, so that an intermediate frequency signal $IF_U$ which is the frequency of the difference thereof is extracted. This is output to the IF amplifier $AMP_{IF}$ commonly used for UHF and VHF. In the IF amplifier $AMP_{IF}$, the predetermined amplification function is carried out, so that the IF output of UHF is obtained.

As in the above, in the conventional circuit, a single terminal has been used as the UHF/VHF mode changing terminal $T_{SW}$.

A television tuner etc. handles high frequency signals, and therefore the wiring of the wiring pattern exerts a great influence upon the characteristics.

Also, in an integrated frequency conversion circuit IC comprising integrated mixing circuits $MIX_V$ and $MIX_U$, local oscillation circuits $OSC_V$ and $OSC_U$, and the IF amplifier $AMP_{IF}$, when the package becomes large and the inner lead portion from the bare chip to the outside becomes long, there arises problems of a parasitic oscillation and a lowering of the gain due to its parasitic inductance and parasitic capacitance.

Accordingly, an integrated circuit IC for a tuner desirably has as small number of terminals as possible and is accommodated in a small package.

In the above-mentioned conventional circuit of FIG. 3, however, the UHF/VHF mode changing terminal $T_{SW}$ is provided independently besides the four terminals $T_5$ to $T_8$ for the connection with the external variable resonance circuit RSN of the local oscillation circuit $OSC_U$, and therefore an increase of the number of terminals is caused and also the package size becomes large. For this reason, there are problems of the parasitic oscillation and lowering of gain, and consequently a defect that the enlargement of the size of the tuner and an increase of the costs are induced.

For the reduction of the number of terminals, usually it can be considered to use the three terminals used for the VHF local oscillation circuit $OSC_V$ and the UHF local oscillation circuit $OSC_U$, but the UHF local oscillation circuit has a high operation frequency, and therefore a differential operation type oscillation circuit is preferable for a stable operation.

In a television tuner etc., the UHF local oscillation circuit has a high operation frequency, and therefore for a stable operation, a differential operation type Colpitz oscillation circuit as shown in FIG. 3 has been used as an oscillator which can stably oscillate over a wide band width.

Accordingly, the four terminals $T_5$ to $T_8$ for the connection with the external variable resonance circuit $RSN_2$ cannot be reduced.

Recently, in a television tuner or mobile radio frequency receiver handling a relatively high frequency signal such as an UHF band or submicrowave band, a further higher stability local oscillator has been required.

So as to satisfy this request, generally there is adopted a method of locking the frequency using for example a PLL (phase locked loop) circuit. As the oscillator used for this, in the frequency conversion circuit of for example a television tuner, a so-called two-output type is ideally used, which can perform output to both of the PLL circuit and the mixing circuit. In the above-mentioned conventional oscillator, however, one oscillation signal output is used for input to the mixing circuit, and therefore the application thereof to locking the frequency using the PLL circuit is difficult.

Here, a case where both of the mixing circuit and the PLL circuit are driven by one oscillation signal output is considered. The mixing circuit and the PLL circuit have optimum input levels, respectively, and therefore a circuit for controlling the level becomes necessary for either of the mixing circuit or the PLL circuit, so that there arises a problem that the circuit becomes complex etc.

Also, when taking a television tuner as an example, the RF signal is input to the mixing circuit in addition to the output of the local oscillator, but where this RF signal is input with a great oscillation width, there is a concern that it will pass the mixing circuit and enter into the PLL circuit. In this case, there is a possibility of a malfunction of the PLL circuit due to the RF signal. For this reason, it must be separated so that the signal is not leaked from the mixing circuit to the PLL circuit. This is cumbersome.

Also, as a method of stably extracting a plurality of oscillation signal outputs, there can be considered a configuration in which a so-called emitter follower EF is added to the output of the oscillator OSC, a configuration in which the buffer amplifier BF is added to the output of the oscillator OSC, or a configuration in which the transistors are connected in cascade. Note that, the loads of the oscillation transistors $Q_1$ and $Q_3$ can be constituted using diodes $D_1$ and $D_2$.

However, the configuration of loading the emitter follower EF and the configuration of adding the buffer amplifier BF involve the problem of an increase of the consumed electric current.

In the configuration of connecting the transistors in cascade, one level's worth of an excess application voltage is necessary, and therefore it is not suitable for the lowering of voltage. Particularly, when the number of the outputs is increased, there is a defect that the application voltage must be increased by that amount.

Further, in a television tuner, ideally use is made of a so-called two-output type in which output to both of the PLL circuit and mixing circuit is possible.

In the local oscillation circuit used in the conventional integrated frequency conversion circuit IC mentioned above, the VHF local oscillation circuit $OSC_V$ is constituted so as to obtain the oscillation signal output via the output buffer $BUF_V$, and therefore, in addition to the output from the emitter side of the transistors $Q_3$ and $Q_4$ of the output buffer $BUF_V$ to the mixing circuit $MIX_V$, the oscillation signal output is obtained from the points of connection between the collectors of the transistors $Q_3$ and $Q_4$ and the load resistance elements $R_6$ and $R_7$. These outputs can be made the outputs to the PLL circuit.

However, in the UHF local oscillation circuit $OSC_U$, only one oscillation signal output is input to the mixing circuit $MIX_U$, and therefore application is difficult to locking the frequency using the PLL circuit.

It is also possible to consider a configuration in which a plurality of oscillation transistors constituting a Colpitz oscillation circuit are connected in parallel to obtain a plurality of outputs, and one among them is used for the PLL circuit, but in this case, the number of the output systems to the PLL circuit becomes two, i.e. a signal output from the output buffer $BUF_V$ of the VHF local oscillation circuit $OSC_V$ and a signal output from the UHF local oscillation circuit $OSC_U$. For inputting an oscillation signal to the PLL circuit basically having one input, it becomes necessary to provide a switching circuit etc., resulting in problems that the connection to the PLL circuit is cumbersome, the number of elements is increased, and so on.

Also, irrespective of the fact that the VHF mixing circuit $MIX_V$ and the UHF mixing circuit $MIX_U$ output the intermediate frequency signals $IF_V$ and $IF_U$ obtained as a result of mixing to the common IF amplifier $AMP_{IF}$ and, as shown in FIG. 4, both circuits have a similar structure, they are quite separately constituted, and therefore there are problems in that an increase of number of components is induced, and thus the increase of costs and enlargement of size are caused.

SUMMARY OF THE INVENTION

An object of the present invention is to provide an integrated oscillation circuit which can achieve a reduction of the number of terminals in a high frequency IC etc., can achieve a reduction of the parasitic oscillation and lowering of gain, and can achieve a reduction of size of the applied tuner etc. and a reduction of cost.

Another object of the present invention is to provide an integrated oscillation circuit in which a balanced output of a plurality of oscillation signals is obtained by a simple circuit without influence exerted upon the oscillation characteristics and in which a reduction of consumption of electric power can be achieved.

Still another object of the present invention is to reduce the number of terminals of the IC by providing a circuit which extracts an oscillation output signal from a plurality of oscillators to a plurality of mixers.

According to the present invention, there is provided an oscillator including, a first oscillating circuit including a first transistor connected to a first resonance circuit and a first load element, the first transistor outputting a first oscillation signal having a first frequency; and a second oscillating circuit including a second transistor connected to a second resonance circuit and a second load element, the second transistor outputting a second oscillation signal having a second frequency. The first transistor and the second transistor are connected to a common load element, and the first and second load elements are formed as an integrated common load element.

Also, according to the present invention, there is provided an oscillator including a first oscillating circuit including a first oscillation transistor connected to a first resonance circuit; and a buffer transistor connected to the first oscillation transistor and a first load element and outputting a first oscillation signal having a first frequency; and a second oscillating circuit including a second oscillation transistor connected to a second resonance circuit and the first load element and outputting a second oscillation signal having a second frequency.

Further, according to the present invention, there is provided a mixer including, a first mixing circuit including a first transistor connected to a first load element and mixing at least two signals to output the resultant mixed signal from the first transistor; and a second mixing circuit including a second transistor connected to a second load element and mixing at least two signals to output the resultant mixed signal from the second transistor. The first transistor and the second transistor are connected a common load element, consisting of the first and second load elements.

According to the present invention, there is provided an oscillator comprising a plurality of transistors, collectors of which are connected to load elements; and a resonance circuit commonly connected to bases of said transistors. The transistors are connected in parallel, and oscillation signals are outputted from the collectors of the transistors.

According to the present invention, there is provided an oscillator including a plurality of pairs of transistors, collectors of which are respectively connected to load elements to form a Colpitz oscillation circuit; and a common resonance circuit connected between bases of the plurality of pairs of transistors. The plurality of pairs of transistors are connected in parallel, and a balanced output of oscillation signals is outputted from the collector of each transistor.

According to the present invention, there is provided an integrated oscillation circuit including, a connection terminal connected to an external resonance circuit and an input line of a mode switching signal which is set at a different level in response to an operation mode; an oscillation element; a bias terminal of which is connected to the connection terminal; a detection circuit detecting the level of said mode switching signal applied to the bias terminal of the oscillation element; and a switching circuit turning on or off a power source for driving the oscillation element in response to the level detected at the detection circuit.

BRIEF DESCRIPTION OF THE DRAWINGS

The above objects and features and other objects and features of the present invention will be become apparently in more detail by the following description with reference to the accompanying drawings, in which.

DESCRIPTION OF THE PREFERRED EMBODIMENTS

Figure 1:
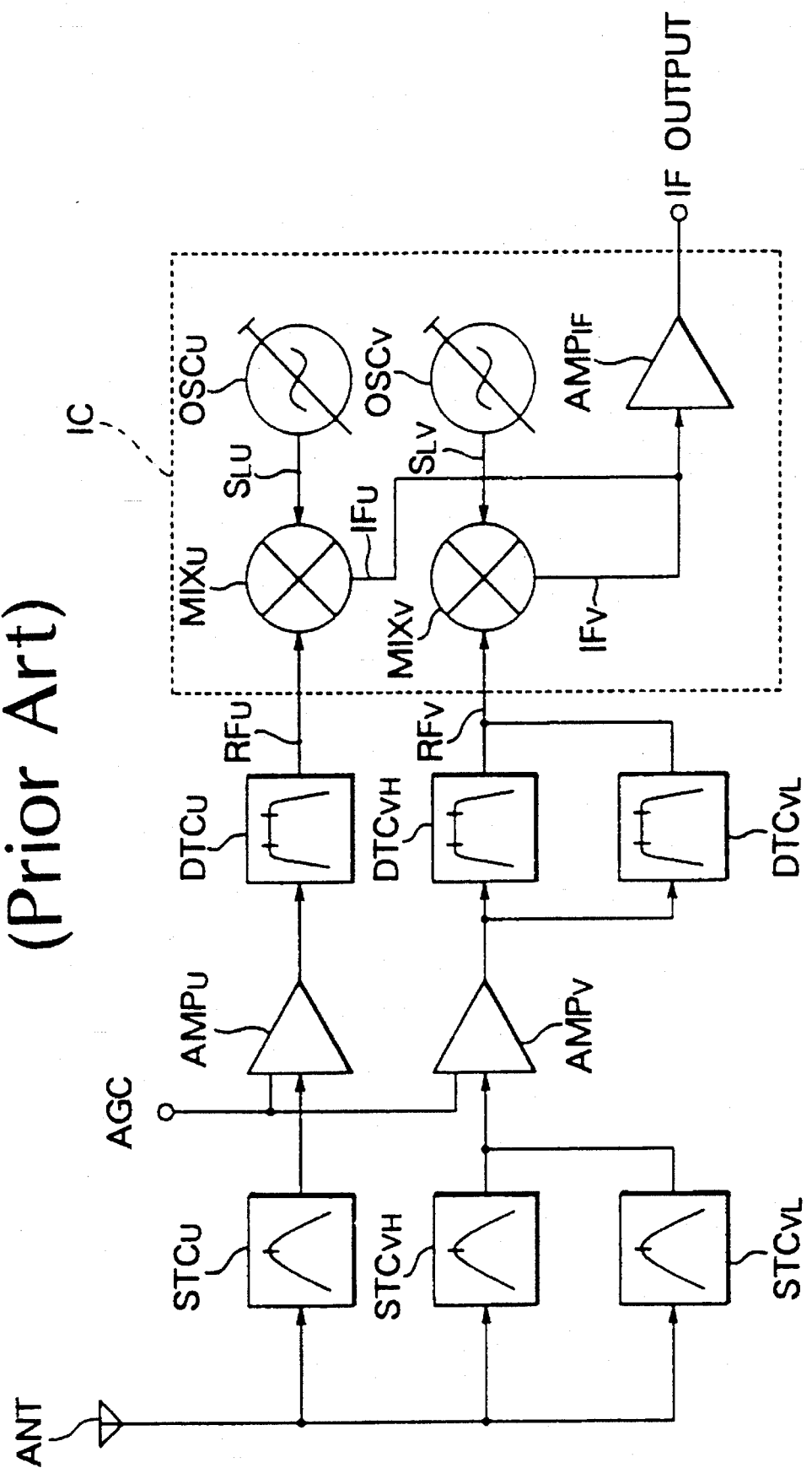
FIG. 1 is a block diagram of a television tuner circuit adapted to UHF/VHF.
Figure 2:
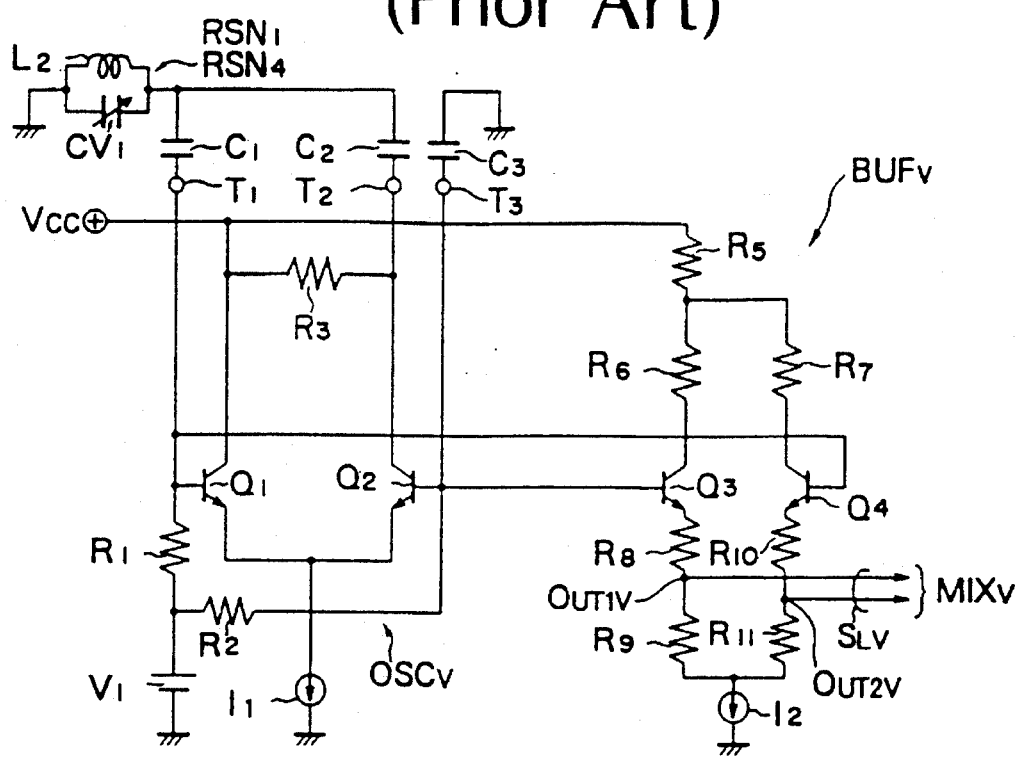
FIG. 2 is a circuit diagram showing one example of the configuration of a general VHF local oscillator.
Figure 3:
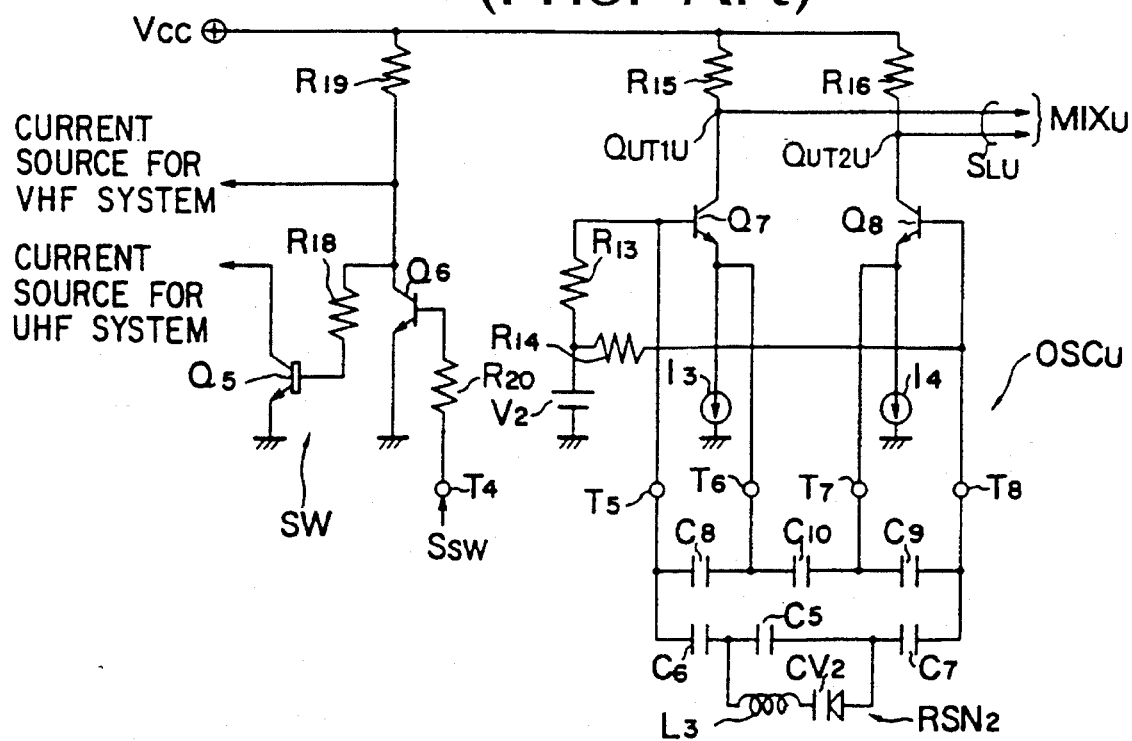
FIG. 3 is a circuit diagram showing one example of the configuration of a general UHF local oscillator.
Figure 4:
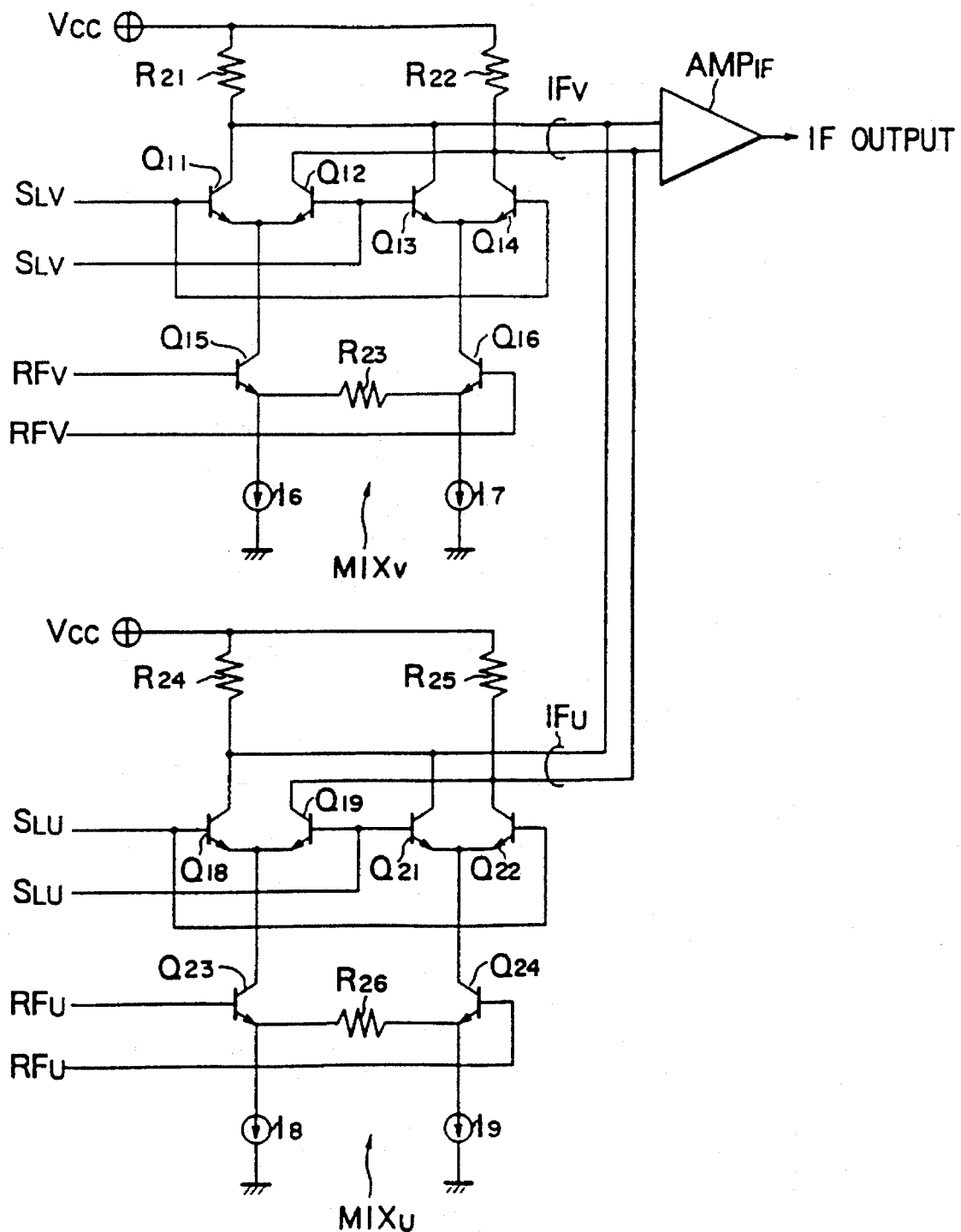
FIG. 4 is a circuit diagram showing one example of the configuration of a general mixer.

The present invention will be explained in detail referring to the drawings.

An explanation will be made first of a first embodiment of the present invention.

Figure 5:
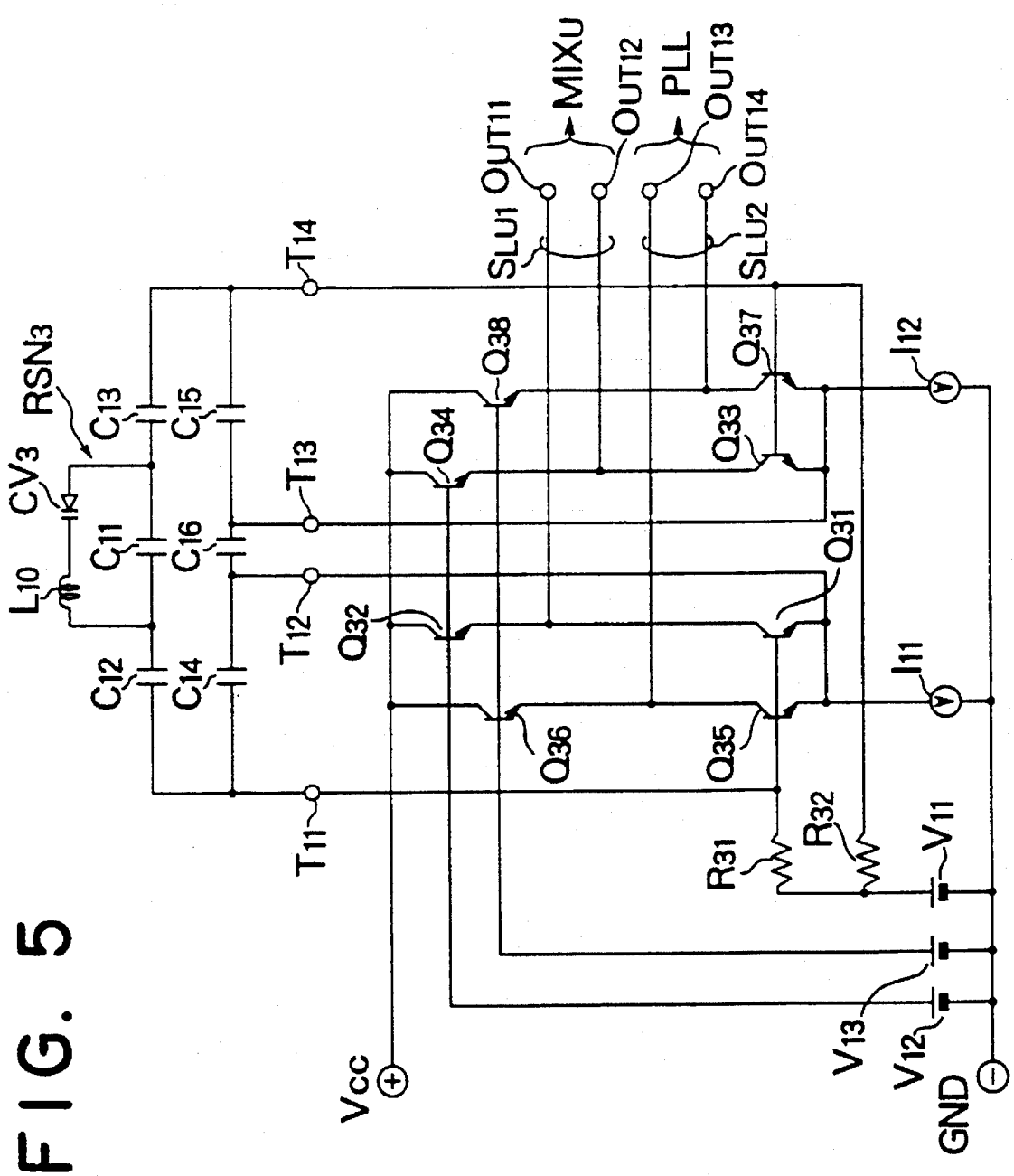
FIG. 5 is a circuit diagram of an oscillator according to a first embodiment of the present invention.

FIG. 5 is a circuit diagram showing a first embodiment of an oscillator according to the present invention applied to a frequency conversion circuit for a television tuner etc.

Namely, $OSC_U$ denotes a UHF local oscillation circuit; $T_{11}$ to $T_{14}$ denote input/output terminals used as connection terminals with an external circuit etc.; $RSN_3$ denotes an external variable resonance circuit; $C_{12}$ and $C_{13}$ denote DC cutting capacitors; $C_{14}$ and $C_{15}$ denote capacitors for a positive feedback; and $C_{14}$ denotes a capacitor for connection, respectively.

Among these circuits, the UHF local oscillation circuit $OSC_U$ is integrated together with a not illustrated UHF mixing circuit, a VHF mixing circuit and local oscillation circuit, and a common IF amplifier. The UHF local oscillation circuit $OSC_U$ is connected via four input/output terminals $T_{11}$ to $T_{14}$ to the external variable resonance circuit $RSN_3$.

The local oscillation circuit $OSC_U$ is constituted by a Colpitz oscillation circuit, consisting of oscillation npn-type transistors $Q_{31}$, $Q_{33}$, $Q_{35}$ and $Q_{37}$, npn-type transistors $Q_{32}$, $Q_{34}$, $Q_{36}$, and $Q_{38}$ functioning as loads, resistance elements $R_{31}$ and $R_{32}$, constant voltage sources $V_{11}$ to $V_{13}$ for biasing; and constant current sources $I_{11}$ and $I_{12}$.

The base of the oscillation transistor $Q_{31}$ is connected to the base of the oscillation transistor $Q_{35}$ and the input/output terminal $T_{11}$ and connected via the resistance element $R_{31}$ to the constant voltage source $V_{11}$. The emitter of the oscillation transistor $Q_{31}$ is connected to the input/output terminal $T_{12}$ and connected to the emitter of the oscillation transistor $Q_{35}$, the connection point of the emitter of the oscillation transistor $Q_{31}$ and the emitter of the oscillation transistor $Q_{35}$ is connected to the constant current source $I_{11}$, and other terminal of the constant current source $I_{11}$ is connected to the ground line GND. The collector of the oscillation transistor $Q_{31}$ is connected to the emitter of the transistor $Q_{32}$ for the load, and the output terminal $O_{UT11}$ of the first differential type Colpitz oscillation circuit is constituted by the connection point of them. This output terminal $O_{OT11}$ is connected to the not illustrated integrated mixing circuit $MIX_U$.

The base of the load transistor $Q_{32}$ is connected to the constant voltage source $V_{12}$, and the collector is connected to the power source voltage $V_{CC}$.

The base of the oscillation transistor $Q_{33}$ is connected to the base of the oscillation transistor $Q_{37}$ and the input/output terminal $T_{14}$ and connected via the resistance element $R_{32}$ to the constant voltage source $V_{11}$. The emitter of the oscillation transistor $Q_{33}$ is connected to the input/output terminal $T_{13}$ and connected to the emitter of the oscillation transistor $Q_{37}$, the connection point of the emitter of the oscillation transistor $Q_{33}$ and the emitter of the oscillation transistor $Q_{37}$ is connected to the constant current source $I_{12}$, and the constant current source $I_{12}$ is connected to the ground line GND. The collector of the oscillation transistor $Q_{33}$ is connected to the emitter of the transistor $Q_{34}$ for the load, and the output terminal $O_{UT12}$ of the first differential operation type Colpitz oscillation circuit is constituted by the connection point of them. This output terminal $O_{UT12}$ is connected to the not illustrated integrated mixing circuit $MIX_U$.

The base of the load transistor $Q_{34}$ is connected to the constant voltage source $V_{12}$, and the collector is connected to the power source voltage $V_{CC}$.

The base of the oscillation transistor $Q_{35}$ is connected, as mentioned before, to the base of the oscillation transistor $Q_{31}$ and connected via the input/output terminal $T_{11}$ and the resistance element $R_{31}$ to the constant voltage source $V_{11}$. The emitter of the oscillation transistor $Q_{35}$ is connected, as mentioned before, to the emitter of the oscillation transistor $Q_{31}$ and connected to the input/output terminal $T_{12}$, and the connection point of the emitter of the oscillation transistor $Q_{35}$ and the emitter of the oscillation transistor $Q_{31}$ is connected to the constant current source $I_{11}$. The collector of the oscillation transistor $Q_{35}$ is connected to the emitter of the load transistor $Q_{36}$, and the output terminal $O_{UT13}$ of the second differential operation type Colpitz oscillation circuit is constituted by the connection point of them. This output terminal $O_{UT13}$ is connected to for example a not illustrated PLL circuit.

The base of the load transistor $Q_{36}$ is connected to the constant voltage source $V_{13}$, and the collector is connected to the line of the power source voltage $V_{CC}$.

The base of the oscillation transistor $Q_{37}$ is connected, as mentioned before, to the base of the oscillation transistor $Q_{33}$ and connected via the input/output terminal $T_{14}$ and the resistance element $R_{32}$ to the constant voltage source $V_{11}$. The emitter of the oscillation transistor $Q_{37}$ is connected, as mentioned before, to the emitter of the oscillation transistor $Q_{33}$ and connected to the input/output terminal $T_{13}$, and the connection point of the emitter of the oscillation transistor $Q_{37}$ and the emitter of the oscillation transistor $Q_{33}$ is connected to the constant current source $I_{12}$. The collector of the oscillation transistor $Q_{37}$ is connected to the emitter of the load transistor $Q_{38}$, and the output terminal $O_{UT14}$ of the second differential type Colpitz oscillation circuit is constituted by the connection point of them. This output terminal $O_{UT14}$ can be connected to for example a not illustrated PLL circuit.

The base of the load transistor $Q_{38}$ is connected to the constant voltage source $V_{13}$, and the collector is connected to the line of the power source voltage $V_{CC}$.

The external variable resonance circuit $RSN_3$ is constituted by connecting a capacitor $C_{11}$ in parallel to a serial circuit of a variable capacitance diode $CV_3$ and a coil $L_{10}$.

The connection point of the coil $L_{10}$ of the external variable resonance circuit $RSN_3$ and the capacitor $C_{11}$ is connected via a DC cutting capacitor $C_{13}$ and the input/output terminal $T_{11}$ to the base of the oscillation transistors $Q_{31}$ and $Q_{35}$, and the connection point of the anode of the variable capacitance diode $CV_3$ and the capacitor $C_{11}$ is connected via the DC cutting capacitor $C_{13}$ and the input/output terminal $T_{14}$ to the bases of the oscillation transistors $Q_{33}$ and $Q_{37}$.

Also, a positive feedback capacitor $C_{14}$ is connected between the connection point of the capacitor $C_{12}$ and input/output terminal $T_{11}$ and the input/output terminal $T_{12}$, and a positive feedback capacitor $C_{15}$ is connected between the connection point of the capacitor $C_{13}$ and input/output terminal $T_{14}$ and the input/output terminal $T_{13}$.

Further, a coupling capacitor $C_{16}$ is connected to the connection point of the capacitor $C_{14}$ and the input/output terminal $T_{12}$ and the connection point of the capacitor $C_{15}$ and the input/output terminal $T_{13}$ i.e., between the emitters of the oscillation transistors $Q$_and $Q_{35}$ and between the emitters of the oscillation transistors $Q_{33}$ and $Q_{37}$.

The local oscillation circuit $OSC_U$ is subjected to a positive feedback via the input/output terminals $T_{11}$ and $T_{12}$, and $T_{13}$ and $T_{14}$ by the capacitors $C_{14}$ and $C_{15}$ connected between the base and emitter of the oscillation transistors $Q_{31}$ and $Q_{33}$. It oscillates at the resonance frequency of the external variable resonance circuit $RSN_3$ connected to the bases of the oscillation transistors $Q_{31}$ and $Q_{35}$ and $Q_{33}$ and $Q_{37}$ and outputs the local oscillation frequency signals $S_{LU1}$ and $S_{LU2}$ at the predetermined frequency from the output terminals $O_{UT11}$ and $O_{UT12}$ and $O_{UT13}$ and $O_{UT14}$ to the not illustrated UHF mixing circuit $MIX_U$ and the PLL circuit, respectively.

Note that, the oscillation transistors $Q_{31}$ and $Q_{33}$ constituting the first differential operation type Colpitz oscillation circuit are mutually connected at their respective bases via the external variable resonance circuit $RSN_3$ and accordingly perform the oscillation operation with out of phases to each other.

Similarly, the oscillation transistors $Q_{35}$ and $Q_{37}$ constituting the second differential operation type Colpitz oscillation circuit are mutually connected at respective bases via the external variable resonance circuit $RSN_3$ and accordingly perform the oscillation operation with out of phases to each other.

Accordingly, local oscillation frequency signals $S_{LU1}$ and $S_{LU2}$ having out of phases to each other are output from the output terminals $O_{UT11}$ and $O_{UT12}$ and $O_{UT13}$ and $O_{UT14}$.

As mentioned above, the present oscillator comprises as basic constituent elements two differential type Colpitz oscillation circuits using two pairs of oscillation transistors $Q_{31}$ and $Q_{33}$ and $Q_{35}$ and $Q_{37}$ and has a structure in which the base and emitter of the oscillation transistors $Q_{31}$ and $Q_{35}$ are connected, the base and emitter of the oscillation transistors $Q_{33}$ and $Q_{37}$ are connected, and the collectors of the respective oscillation transistors $Q_{31}$, $Q_{33}$, $Q_{35}$, and $Q_{37}$ are separated from each other.

The Colpitz oscillation circuit of the present embodiment is basically an oscillation circuit grounded at its collector. The collector-grounded oscillation is oscillation between the emitter and base of the transistor in other words.

Accordingly, if the base and emitter of the transistor are commonly connected as in the oscillation transistors $Q_{31}$ and $Q_{33}$ and $Q_{35}$ and $Q_{37}$ of the present oscillator, the oscillation transistor will be increased.

This is equivalent to the reduction of base resistors deteriorating the high frequency characteristic of the transistor. The oscillation strength is enhanced and the performance becomes better.

Also, even if the bases and emitters of the oscillation transistors $Q_{31}$ and $Q_{33}$ and $Q_{35}$ and $Q_{37}$ are commonly connected, the respective collectors are separated as mentioned above, and therefore even if for example the output terminals $O_{UT11}$ and $O_{UT12}$, are connected to the UHF mixing circuit $MIX_U$ and the output terminals $O_{UT13}$ and $O_{UT14}$ are connected to the PLL circuit, the signal will not directly go around from the mixing circuit $MIX_U$ to the PLL circuit.

Further, the output amplitudes of the oscillation signals $S_{LU1}$ and $S_{LU2}$ are determined by the product between the collector current of the oscillation transistors $Q_{31}$ and $Q_{33}$ and $Q_{35}$ and $Q_{37}$ and the load impedance.

The collector current of oscillation transistors $Q_{31}$ and $Q_{33}$ and $Q_{35}$ and $Q_{37}$ flows while the current from the constant current source $I_{11}$ is divided in proportion to the size of the oscillation transistors $Q_{31}$ and $Q_{33}$ and flows while the current by the constant current source $I_{12}$ is divided in proportion to the size of the oscillation transistors $Q_{35}$ and $Q_{37}$, and therefore by appropriately selecting the size ratio of the oscillation transistors and the value of the current source, the output amplitude of the oscillation signals $S_{LU1}$ and $S_{LU2}$ can be freely set up.

As explained above, according to the present embodiment, there are advantages such that a balanced output of a plurality of oscillation signals can be extracted with any amplitude by a simple circuit without an influence exerted upon the oscillation characteristic and a reduction of power consumption can be achieved.

Note that, in the present embodiment, transistors $Q_{32}$ and $Q_{34}$ and $Q_{36}$ and $Q_{38}$, are used as the load elements, but the elements are not restricted to them, and there arises no problem even if a resistance element or diode is used.

The load element converts the collector current of the oscillation transistors $Q_{31}$ and $Q_{33}$ and $Q_{35}$ and $Q_{37}$ to voltage. Further, the Colpitz oscillation circuit of the present embodiment is basically a collector-grounded oscillation circuit as mentioned before. Therefore, the collectors of the oscillation transistors $Q_{31}$ and $Q_{33}$ and $Q_{35}$ and $Q_{37}$ are grounded at a low impedance, and there is a function of lowering the output impedance of the oscillation signal output, and therefore it is also possible to use a resistance element so far as the impedance is low.

Also, in the present embodiment, an explanation was made using a differential operation type oscillator using a plurality of pairs of oscillation transistors as an example, but needless to say effects similar to the effects mentioned above are obtained even if the oscillation transistor is not a differential operation type and has a so-called single configuration comprising only the oscillation transistors $Q_{31}$ and $Q_{33}$ or only $Q_{35}$ and $Q_{37}$ in FIG. 5.

Next, a second embodiment of the present invention will be explained.

Figure 6:
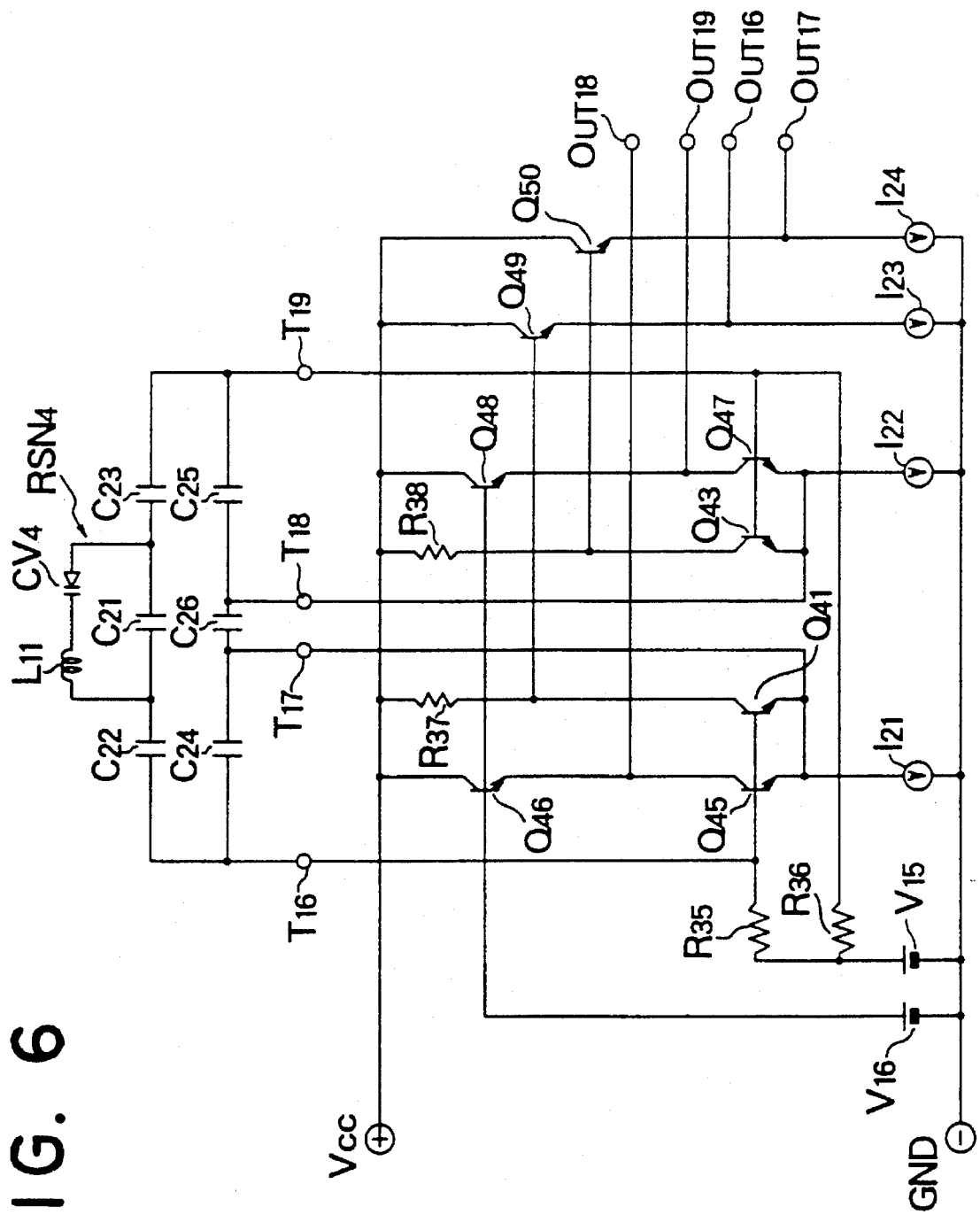
FIG. 6 is a circuit diagram of another oscillator according to a second embodiment of the present invention.

FIG. 6 is a circuit diagram showing the second embodiment of the oscillator according to the present invention.

The present embodiment differs from the above-described first embodiment in that resistance elements $R_{37}$ and $R_{38}$, having a low impedance are used in place of the use of the npn-type transistors as the load elements of the oscillation transistors $Q_{31}$ and $Q_{33}$.

In the present embodiment, a series-connected npn-type transistor $Q_{49}$ and constant current source $I_{23}$ and npn-type transistor $Q_{50}$ and constant current source $I_{24}$ are connected in parallel between the power source voltage $V_{CC}$ and the ground line GND, the connection point between the collector of the oscillation transistor $Q_{41}$ and the resistance element $R_{37}$ is connected to the base of the npn-type transistor $Q_{49}$, the connection point between the collector of the oscillation transistor $Q_{43}$ and the resistance element $R_{38}$ is connected to the base of the npn-type transistor $Q_{50}$, the connection point between the emitter of the npn-type transistor $Q_{49}$ and the constant current source $I_{23}$ is made the output terminal $O_{UT16}$, and the connection point between the emitter of the npn-type transistor $Q_{50}$ and the constant current source $I_{24}$ is made the output terminal $O_{UT17}$, whereby a plurality of outputs are obtained.

Also in the oscillator according to the present embodiment having such a configuration, effects similar to the effects of the above-mentioned first embodiment can be obtained.

Note that, in addition to the above-described configuration, for example, npn-type transistors are respectively cascade-connected between the connection point between the load resistance element $R_{37}$ and output terminal $O_{UT16}$ and the collector of the oscillation transistor $Q_{41}$ and between the connection point between the load resistance element $R_{38}$ and output terminal $O_{UT17}$ and the collector of the oscillation transistor $Q_{43}$, and the bases of the cascade-connected npn-type transistors are grounded, whereby the output terminal $O_{UT16}$ and $O_{UT17}$ side can be retained stably at a low impedance.

An explanation will be made next of a third embodiment of the present invention.

Figure 7:
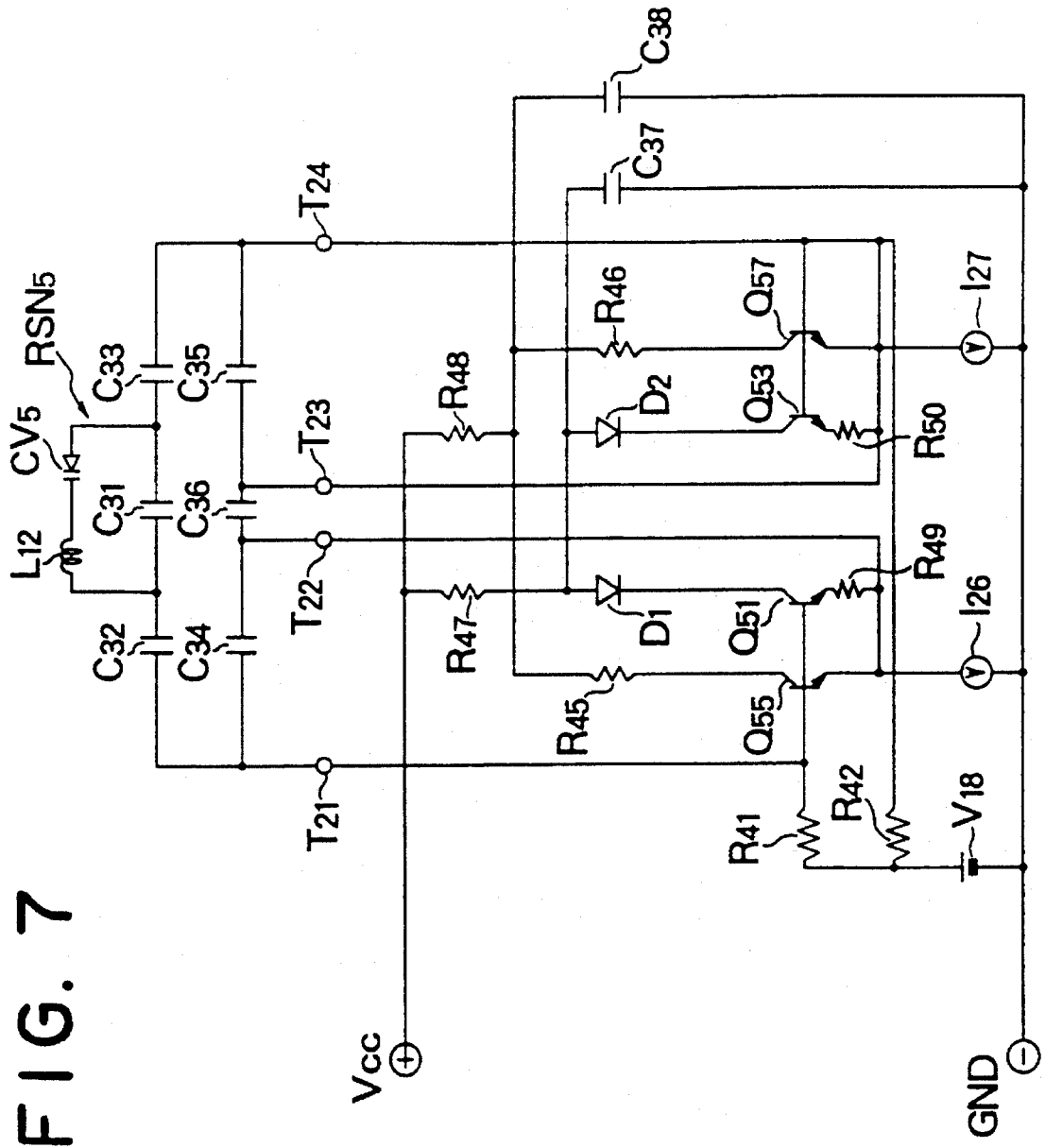
FIG. 7 is a circuit diagram of another oscillator according to a third embodiment of the present invention.

FIG. 7 is a circuit diagram showing the third embodiment of the oscillator according to the present invention.

The present embodiment differs from the above-described first embodiment in that diodes $D_1$ and $D_2$ and the resistance elements $R_{45}$ and $R_{46}$ are used instead of use of the npn-type transistors as the load elements of the oscillation transistors $Q_{31}$, $Q_{33}$, $Q_{35}$, and $Q_{37}$.

Concretely, in FIG. 7, the diodes $D_1$ and $D_2$ are used as the load elements of the oscillation transistors $Q_{51}$ and $Q_{53}$, the cathode of the diode $D_1$ is connected to the collector of the oscillation transistor $Q_{51}$, and the cathode of the diode $D_2$ is connected to the collector of the oscillation transistor $Q_{53}$.

Also, anodes of the diodes $D_1$ and $D_2$ are connected to each other, and the connection point between them is connected via the resistance element $R_{47}$ to the power source voltage $V_{CC}$ and connected to one electrode of the capacitor $C_{37}$. The other electrode of the capacitor $C_{37}$ is connected to the ground line GND.

Further, emitter resistance elements $R_{49}$ and $R_{50}$ are connected to the oscillation transistors $Q_{51}$ and $Q_{53}$, respectively.

In the case where the load element is the diode, a distortion is increased at a large input in comparison with the case where the load element is a resistance element, and therefore these emitter resistance elements $R_{49}$ and $R_{50}$ are inserted for a purpose of suppressing this distortion.

Also, as the load element of the oscillation transistors $Q_{55}$ and $Q_{57}$, the resistance elements $R_{45}$ and $R_{46}$ are used. One end of the resistance element $R_{45}$ is connected to the collector of the oscillation transistor $Q_{55}$, and one end of the resistance element $R_{46}$ is connected to the collector of the oscillation transistor $Q_{57}$.

Also, the other ends of the resistance elements $R_{45}$ and $R_{46}$ are connected to each other, and the connection point between them is connected via the resistance element $R_{48}$ to the line of the power source voltage $V_{CC}$ and connected to one electrode of the capacitor $C_{38}$. The other electrode of the capacitor $C_{38}$ is connected to the ground line GND.

Note that, the resistance element is not connected to the emitter of the oscillation transistors $Q_{55}$ and $Q_{57}$ in which the load element is the resistance element since the resistance element which is the load element moderates the distortion.

In such a configuration, the resistance element $R_{47}$ and capacitor $C_{37}$ and the resistance element $R_{48}$ and capacitor $C_{38}$ have a function of a low pass filter and reduce the high frequency of the oscillation.

The rest of the configuration is similar to the first embodiment of the present invention. Also in the oscillator according to the present embodiment, effects similar to the effects of the above-mentioned first embodiment can be obtained.

Next, an explanation will be made of fourth and fifth embodiments of the present invention.

Figure 8A:
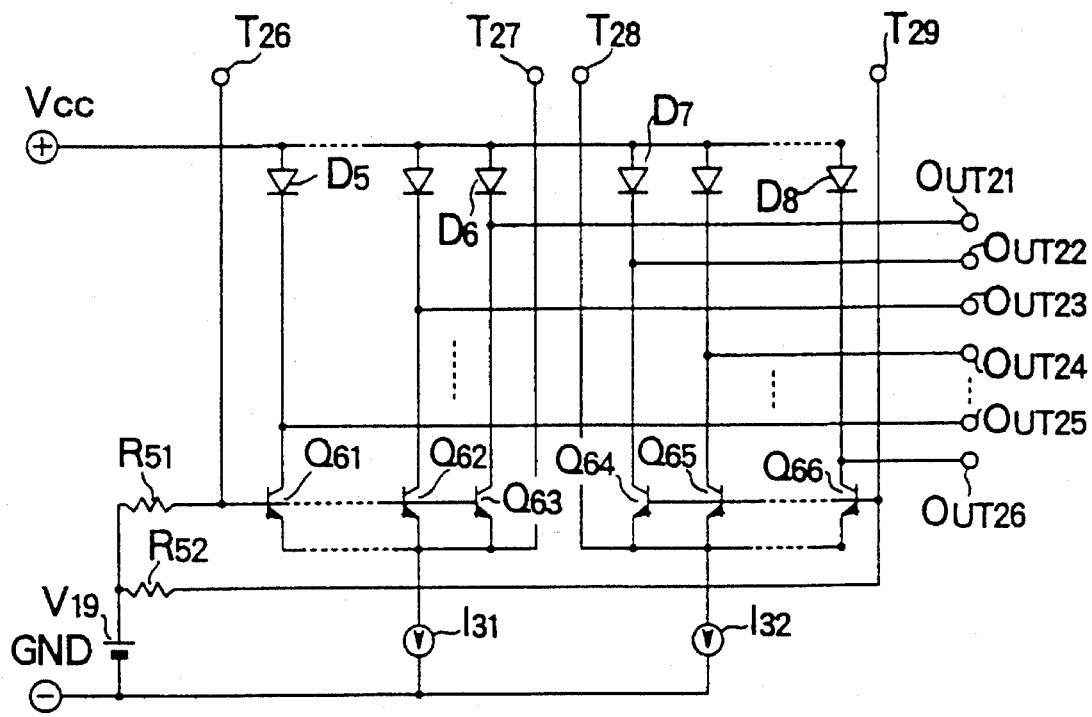
FIGS. 8A and 8B are circuit diagrams of other oscillators according to fourth and fifth embodiments of the present invention.
Figure 8B:
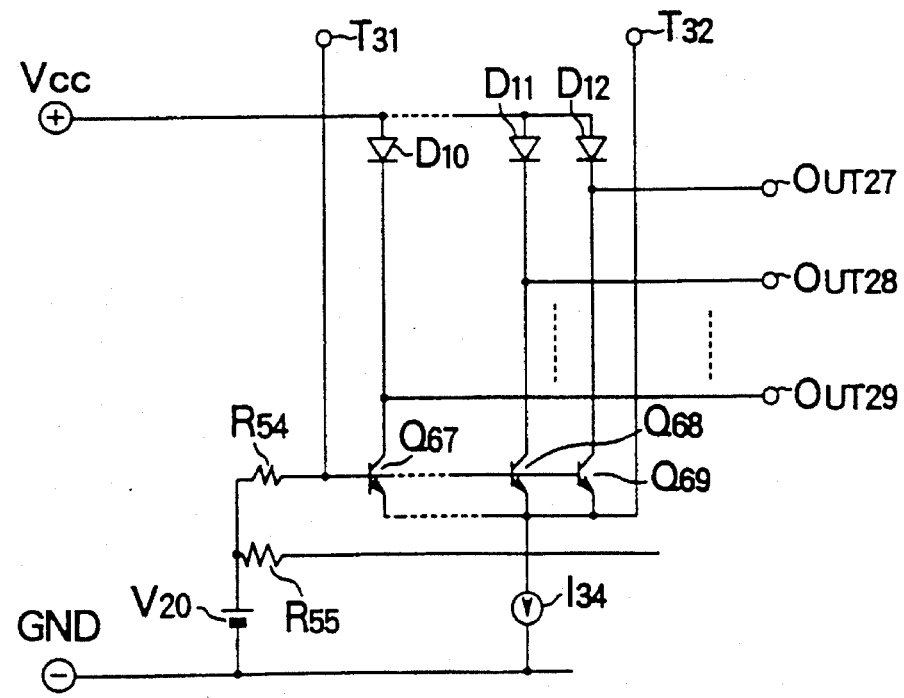

FIGS. 8A and 8B are circuit diagrams showing the fourth and fifth embodiments of the oscillator according to the present invention.

The present embodiment differs from the above-described first to third embodiments in that the configuration is made so that, instead of two differential outputs being obtained using two pairs of oscillation transistors, n (n is an integer of 3 or more) pairs (2×n) or n oscillation transistors are used to obtained n outputs.

In FIG. 8, FIG. 8-A shows a differential operation type n-output oscillator; and FIG. 8B shows a single type n-output oscillator.

Concretely, in FIG. 8A, the oscillation transistors $Q_{61}$, $Q_{62}$, and $Q_{63}$ are commonly connected to each other at their bases, and the bases thereof are connected via the input/output terminals $T_{26}$ and the resistor $R_{51}$ to the constant voltage source $V_{19}$. Also, the emitters of the oscillation transistors $Q_{61}$, $Q_{62}$, and $Q_{63}$ are commonly connected to each other and are connected to the input/output terminal $T_{27}$ and the constant current source $I_{31}$, and the constant current source $I_{31}$ is connected to the ground line GND. The collector of the oscillation transistor $Q_{61}$ is connected to the cathode of the load diode, and the first output terminal $O_{UT25}$ is constituted from the connection point between them.

The collectors of the oscillation transistors $Q_{62}$ and $Q_{63}$ are connected to the cathode of the load diode in the same way as the transistor $Q_{61}$, respectively, and a second output terminal $O_{UT23}$ and a third output terminal $O_{UT21}$ are constituted from the connection point between them. The anode side of these load diodes is connected to the line of the power source voltage $V_{CC}$.

The oscillation transistors $Q_{64}$, $Q_{65}$, and $Q_{66}$ are commonly connected to each other at their bases, and the bases thereof are connected via the input/output terminals $T_{29}$ and the resistor $R_{52}$ to the constant voltage source $V_{19}$. Also, the emitters of the oscillation transistors $Q_{64}$, $Q_{65}$, and $Q_{66}$ are commonly connected to each other and are connected to the input/output terminal $T_{28}$ and the constant current source $I_{32}$, and the constant current source $I_{32}$ is connected to the ground line GND. The collector of the oscillation transistor $Q_{66}$ is connected to the cathode of the load diode, and the first output terminal $O_{UT26}$ is constituted from the connection point between them.

The collectors of the oscillation transistors $Q_{65}$ and $Q_{64}$ are connected to the cathode of the load diode in the same way as the transistor $Q_{66}$, respectively, and a second output terminal $O_{UT24}$ and a third output terminal $O_{UT22}$ are constituted from the connection point between them. The anode side of these load diodes is connected to the line of the power source voltage $V_{CC}$.

According to the oscillator according to the present embodiment having such a configuration, in the same way as the effect of the above-mentioned first embodiment, three sets of differential outputs can be obtained. Note that, in the present embodiment, a case of three sets was indicated, but it is true also for the case of four sets or more.

Also, in the present embodiment, a case where the load element was the diode was used, but there is no problem even if it is a resistor or an npn-type transistor as in the first to third embodiments.

An explanation will be made next of FIG. 8B. The oscillation transistors $Q_{67}$, $Q_{68}$, and $Q_{69}$ are commonly connected to each other at their bases, and the bases thereof are connected via the input/output terminals $T_{31}$ and the resistor $R_{54}$ to the constant voltage source $V_{20}$. Also, the emitters of the oscillation transistors $Q_{67}$, $Q_{68}$, and $Q_{69}$ are commonly connected to each other and are connected to the input/output terminal $T_{32}$ and the constant current source $I_{34}$, and the constant current source $I_{34}$ is connected to the ground line GND. The collector of the oscillation transistor $Q_{67}$ is connected to the cathode of the load diode, and the first output terminal $O_{UT29}$ is constituted from the connection point between them.

The collectors of the oscillation transistors $Q_{68}$ and $Q_{69}$ are connected to the cathode of the load diode in the same way as $Q_{67}$, respectively, and a second output terminal $O_{UT27}$ and a third output terminal $O_{UT26}$ are constituted from the connection point between them. The anode side of these load diodes is connected to the line of the power source voltage $V_{CC}$.

The external variable resonance circuit is connected between the input/output terminal $T_{31}$ and the ground via the DC cutting capacitor. A positive feedback capacitor is connected between the input/output terminals $T_{31}$ and $T_{32}$, and further the ground capacitor is connected between the $T_{32}$ and the ground.

By the above configuration, the circuit operates as a Colpitz oscillation circuit.

Also, in the present embodiment, a case where the load element is a diode is mentioned, but there is no problem even if it is a resistor or an npn-type transistor as in the first to third embodiments.

In this way, in the present embodiment, three or more outputs can be obtained, and therefore an oscillator of a high general usefulness can be realized.

As explained above, according to the present invention, a balanced output of a plurality of oscillation signals can be extracted with any amplitude by a simple circuit without an influence exerted upon the oscillation characteristic, and an oscillator of a high general usefulness which can achieve the reduction of the consumption of electric power can be realized.

Art explanation will be made next of a sixth embodiment of the present invention.

Figure 9:
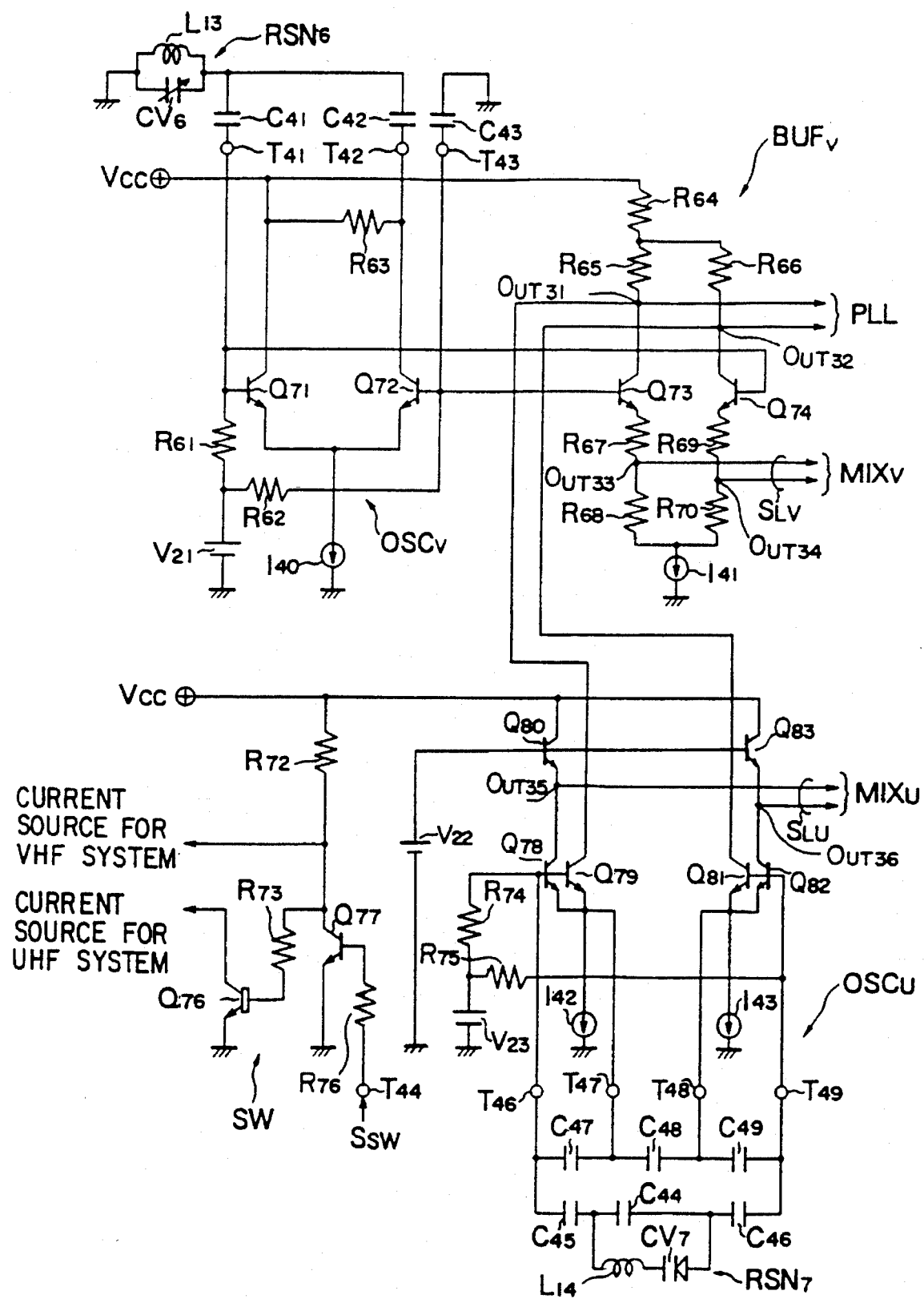
FIG. 9 shows an oscillator according to a sixth embodiment of the present invention and a buffer circuit and a switch circuit used in the same.

FIG. 9 is a circuit diagram showing one embodiment of a UHF/VHF oscillator according to the present invention applied to an integrated frequency conversion circuit for a television tuner.

A VHF local oscillation circuit $OSC_V$ is constituted by oscillation npn-type transistors $Q_{71}$ and $Q_{72}$ constituting a positive feedback differential amplifier type oscillation circuit; a biasing constant voltage source $V_{21}$ of the oscillation npn-type transistors $Q_{71}$ and $Q_{72}$; resistance elements $R_{61}$, $R_{62}$, and $R_{63}$; and a constant current source $I_{40}$.

The base of the oscillation transistor $Q_{71}$ is connected to the input/output terminal $T_{41}$ and connected via the resistance element $R_{61}$ to the constant voltage source $V_{21}$ and further connected to the base of the npn-type transistor $Q_{74}$ of the output buffer $BUF_V$. The emitter of the oscillation transistor $Q_{71}$ is connected to the constant current source $I_{40}$, and the other terminal of the constant current source $I_{40}$ is grounded. The collector of the oscillation transistor $Q_{71}$ is connected to the line of the power source voltage $V_{CC}$.

The base of the oscillation transistor $Q_{72}$ is connected to the input/output terminal $T_{43}$ and connected via the resistance element $R_{62}$ to the constant voltage source $V_{21}$ and further connected to the base of the npn-type transistor $Q_{73}$ of the output buffer $BUF_V$. The emitter of the oscillation transistor $Q_{72}$ is connected to the constant current source $I_{40}$, and the collector is connected to the input/output terminal $T_{42}$. Also, the resistance element $R_{63}$ is connected between the collector of the oscillation transistor $Q_{72}$ and the line of the power source voltage $V_{CC}$.

The external variable resonance circuit $RSN_6$ is constituted by the variable capacitance capacitor $CV_6$ and the coil $L_{13}$ which are connected in parallel.

The connection point between one end of the coil $L_{13}$ of the external variable resonance circuit $RSN_6$ and one electrode of the variable capacitance capacitor $CV_6$ is grounded. The connection point between the other end of the coil $L_{13}$ and the other electrode of the variable capacitance capacitor $CV_6$ is connected via the capacitor $C_{41}$ and the input/output terminal $T_{41}$ to the base of the oscillation transistor $Q_{71}$ and connected via the capacitor $C_{42}$ and the input/output terminal $T_{42}$ to the collector of the oscillation transistor $Q_{72}$.

Also, one electrode of the capacitor $C_{43}$ is connected to the input/output terminal $T_{43}$, and the other electrode of the capacitor $C_{43}$ is grounded.

The VHF local oscillation circuit $OSC_V$ is subjected to a positive feedback by the externally attached capacitor $C_{41}$ connected via the input/output terminals $T_{42}$ and $T_{41}$ to the base of the oscillation transistor $Q_{71}$. It oscillates at the resonance frequency of the external variable resonance circuit $RSN_6$ and outputs to the output buffer $BUF_V$.

The output buffer $BUF_V$ is constituted by npn-type transistors $Q_{73}$ and $Q_{74}$, the load resistance elements $R_{64}$ to $R_{66}$, resistance elements $R_{67}$ to $R_{70}$, and a constant current source $I_{41}$.

The base of the transistor $Q_{73}$ is connected to the base of the oscillation transistor $Q_{72}$ of the local oscillation circuit $OSC_V$ as mentioned above, the emitter thereof is connected via the series-connected resistance elements $R_{67}$ and $R_{68}$ to the constant current source $I_{41}$, and the other terminal of the constant current source $I_{41}$ is grounded. The collector of the transistor $Q_{73}$ is connected via the series-connected load resistance elements $R_{45}$ and $R_{68}$ to the line of the power source voltage $V_{CC}$.

Note that, the output terminal $O_{UT33}$ of the VHF local oscillation circuit is constituted by the connection point between the resistance element $R_{67}$ and the resistance element $R_{68}$. The output terminal $O_{UT33}$ of this is connected to the not illustrated integrated VHF mixing circuit $MIX_V$.

Also, the output terminal $O_{UT31}$ of the oscillation signal to the not illustrated PLL circuit is constituted by the connection point between the collector of the transistor $Q_{73}$ and the load resistance element $R_{65}$.

The base of the transistor $Q_{74}$ is connected to the base of oscillation transistor $Q_{71}$ of the local oscillation circuit $OSC_V$ as mentioned above, and the emitter thereof is connected via the series-connected resistance elements $R_{69}$ and $R_{70}$ to the constant current source $I_{41}$. The collector of the transistor $Q_{74}$ is connected via the load resistance element $R_{66}$ to the connection point between the series-connected load resistance elements $R_{65}$ and $R_{64}$.

Note that, the output terminal $O_{UT34}$ of the VHF local oscillation circuit is constituted by the connection point between the resistance element $R_{69}$ and the resistance element $R_{70}$. The output terminal $O_{UT34}$ of this is connected to the not illustrated VHF integrated mixing circuit $MIX_V$.

Also, the output terminal $O_{UT32}$ of the oscillation signal to the not illustrated PLL circuit is constituted by the connection point between the collector of the transistor $Q_{74}$ and the load resistance element $R_{66}$.

Art explanation will be made next of the UHF local oscillation circuit $OSC_U$. It is constituted by oscillation npn-type transistors $Q_{78}$, $Q_{79}$, $Q_{81}$, and $Q_{82}$ which constitute a differential operation type Colpitz oscillation circuit; load npn-type transistors $Q_{80}$ and $Q_{83}$; resistance elements $R_{74}$ and $R_{75}$; biasing constant voltage sources $V_{22}$ and $V_{23}$; and constant current sources $I_{42}$ and $I_{43}$.

The base of the oscillation transistor $Q_{78}$ is connected to the base of the oscillation transistor $Q_{79}$ and the input/output terminal $T_{46}$ and connected via the resistance element $R_{74}$ to the constant voltage source $V_{23}$. The emitter of the oscillation transistor $Q_{78}$ is connected to the input/output terminal $T_{47}$ and connected to the emitter of the oscillation transistor $Q_{79}$, the connection point between the emitter of the oscillation transistor $Q_{78}$ and the emitter of the oscillation transistor $Q_{79}$ is connected to the constant current source $I_{42}$, and the constant current source $I_{42}$ is connected to the ground line GND. The collector of the oscillation transistor $Q_{78}$ is connected to the emitter of the load transistor $Q_{80}$, and the output terminal $O_{UT35}$ of the first differential operational type Colpitz oscillation circuit is constituted by the connection point between them. This output terminal $O_{UT35}$ is connected to the not illustrated integrated mixing circuit $MIX_U$.

The base of the load transistor $Q_{80}$ is connected to the constant voltage source $V_{22}$, and the collector is connected to the line of the power source voltage $V_{CC}$.

The collector of the oscillation transistor $Q_{79}$ is connected to the output terminal $O_{UT31}$ to the PLL circuit which is the connection point between the collector of the transistor $Q_{73}$ of the output buffer $BUF_V$ of the VHF local oscillation circuit $OSC_V$ and the load resistance element $R_{65}$.

The base of the oscillation transistor $Q_{82}$ is connected to the base of the oscillation transistor $Q_{81}$ and the input/output terminal $T_{49}$ and connected via the resistance element $R75$ to the constant voltage source $V_{23}$. The emitter of the oscillation transistor $Q_{82}$ is connected to the input/output terminal $T_{48}$ and connected to the emitter of the oscillation transistor $Q_{81}$, the connection point between the emitter of the oscillation transistor $Q_{82}$ and the emitter of the oscillation transistor $Q_{82}$ is connected to the constant current source $I_{43}$, and the constant current source $I_{43}$ is connected to the ground line GND. The collector of the oscillation transistor $Q_{82}$ is connected to the emitter of the load transistor $Q_{83}$, and the output terminal $O_{UT36}$ of the first differential operation type Colpitz oscillation circuit is constituted by the connection point between them. This output terminal $O_{UT36}$ is connected to the not illustrated integrated mixing circuit $MIX_U$.

The base of the load transistor $Q_{83}$ is connected to the constant voltage source $V_{22}$, and the collector is connected to the line of the power source voltage $V_{CC}$.

The collector of the oscillation transistor $Q_{79}$ is connected to the output terminal $O_{UT32}$ to the PLL circuit which is the connection point between the collector of the transistor $Q_{74}$ of the output buffer $BUF_V$ of the VHF local oscillation circuit $OSC_V$ and the load resistance element $R_{66}$.

In this way, the UHF local oscillation circuit $OSC_U$ commonly uses the load elements of the oscillation transistors $Q_{79}$ and $Q_{81}$ and the load resistance elements $R_{64}$ to $R_{66}$ of the output buffer $BUF_V$ of the VHF local oscillation circuit $OSC_V$ and commonly uses also the output terminals $O_{UT31}$ and $O_{UT32}$ to the PLL circuit.

The external variable resonance circuit $RSN_7$ is constituted by connecting a capacitor $C_{44}$ in parallel to a serial circuit of a variable capacitance diode $C_7$ and the coil $L_{14}$.

The connection point between the coil $L_{14}$ of the external variable resonance circuit $RSN_7$ and the capacitor $C_{44}$ is connected via the DC cutting capacitor $C_{45}$ to the input/output terminal $T_{46}$ to the bases of the oscillation transistors $Q_{78}$ and $Q_{79}$, and the connection point between the anode of the variable capacitance diode $CV_7$ and the capacitor $C_{44}$ is connected via the DC cutting capacitor $C_{46}$ and the input/output terminal $T_{49}$ to the bases of the oscillation transistors $Q_{81}$ and $Q_{82}$.

Also, a positive feedback capacitor $C_{47}$ is connected between the connection point between the capacitor $C_{45}$ and input/output terminal $T_{46}$ and the input/output terminal $T_{47}$, and a positive feedback capacitor $C_{49}$ is connected between the connection point between the capacitor $C_{46}$ and input/output terminal $T_{49}$ and the input/output terminal $T_{48}$.

Further, a coupling capacitor $C_{48}$ is connected between the connection point between the capacitor $C_{47}$ and the input/output terminal $T_{47}$ and the connection point between the capacitor $C_{49}$ and the input/output terminal $T_{48}$ (between the emitters of the oscillation transistors $Q_{78}$ and $Q_{79}$ and the emitters of the oscillation transistors $Q_{81}$ and $Q_{82}$).

The UHF local oscillation circuit $OSC_U$ is subjected to a positive feedback by the externally attached capacitors $C_{47}$ and $C_{49}$ connected between the bases and emitters of the oscillation transistors $Q_{78}$ and $Q_{79}$ and $Q_{82}$ and $Q_{82}$ via the input/output terminals $T_{46}$, $T_{47}$, $T_{48}$, and $T_{49}$. It is oscillated by the resonance frequency of the external variable resonance circuit $RSN_7$ connected to respective bases of the oscillation transistors $Q_{78}$ and $Q_{79}$ and $Q_{81}$ and $Q_{82}$ and outputs the local oscillation frequency signal $S_{LU}$ at the predetermined frequency from the output terminals $O_{UT35}$ and $O_{UT36}$ to the UHF mixing circuit $MIX_U$.

Note that, the oscillation transistors $Q_{78}$ and $Q_{79}$ and $Q_{81}$ and $Q_{82}$ constituting the differential operation type Colpitz oscillation circuit perform oscillation operations of out of phases to each other since the respective bases are mutually connected via the external variable resonance circuit $RSN_7$.

Accordingly, local oscillation frequency signals having out of phases to each other are output from the output terminals $O_{UT35}$ and $O_{UT36}$.

The switching circuit SW is constituted by switching operation npn-type transistor $Q_{76}$ and $Q_{77}$ and the resistance elements $R_{73}$, $R_{72}$, and $R_{76}$.

The base of the switching transistor $Q_{76}$ is connected via the resistance element $R_{73}$ to the collector of the switching transistor $Q_{77}$, the emitter is grounded, and the collector is connected to the not illustrated UHF system current source.

The base of the switching transistor $Q_{77}$ is connected via the $R_{76}$ to the switching terminal $T_{44}$, the emitter is grounded, the connection point between the collector and the resistance element $R_{73}$ is connected via the high resistance element $R_{72}$, to the line of the power source voltage $V_{CC}$, and the connection point between the collector and the resistance element $R_{73}$ and the connection point with the high resistance element $R_{72}$ is connected to the not illustrated VHF system current source.

Figure 10:
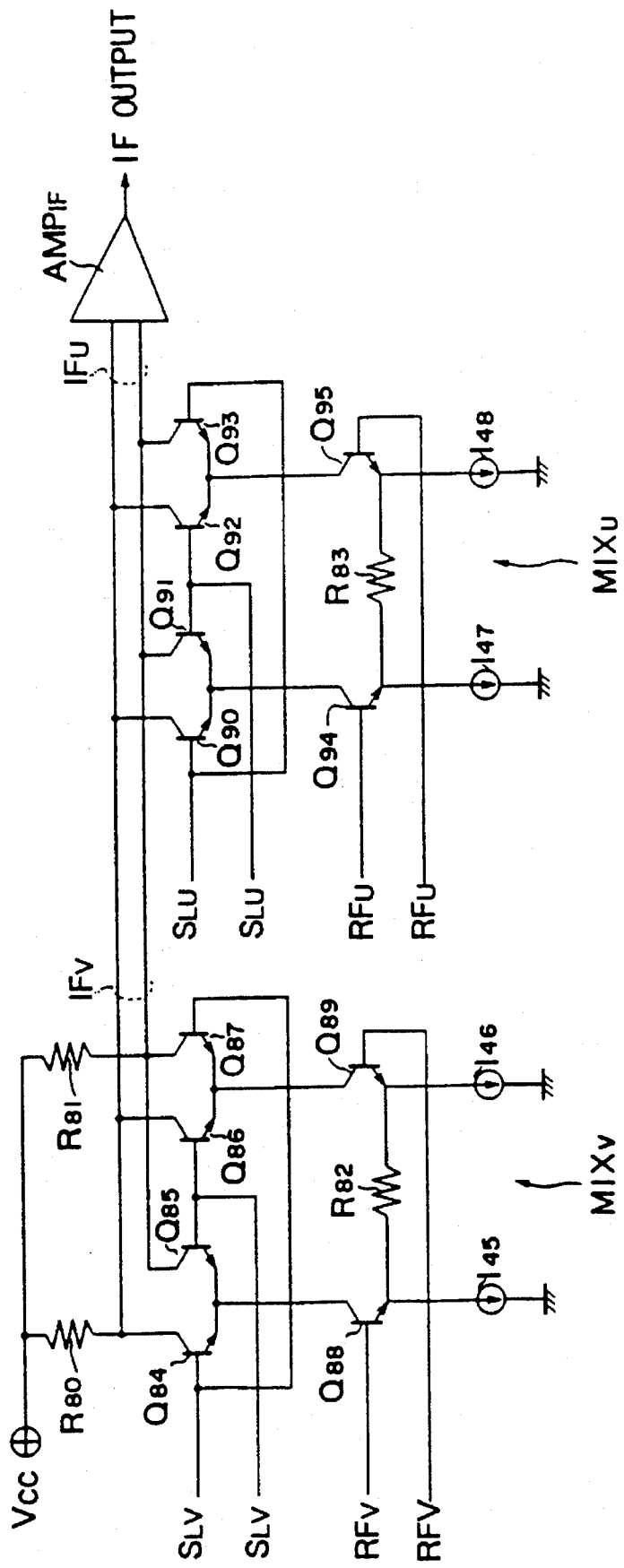
FIG. 10 shows a circuit diagram of a UHF and VHF mixer according to a seventh embodiment of the present invention.

Art explanation will be made next of a UHF and VHF mixing circuit and an IF amplifier using FIG. 10.

The VHF mixing circuit $MIX_V$ is constituted by npn-type transistors $Q_{84}$ to $Q_{89}$, resistance elements $R_{80}$ to $R_{82}$ and constant current sources $I_{45}$ and $I_{46}$.

The base of the transistor $Q_{84}$ is connected to the output of the VHF local oscillation circuit $OSC_V$ and the base of the transistor $Q_{87}$. The emitter of the transistor $Q_{84}$ is connected to the emitter of the transistor $Q_{85}$ and the collector of the transistor $Q_{88}$. The collector of the transistor $Q_{84}$ is connected via the resistance element $R_{80}$ to the line of the power source voltage $V_{CC}$, and the connection point between the collector and the resistance element $R_{80}$ is connected to the collector of the transistor $Q_{86}$ and further connected to one input of the IF amplifier $AMP_{IF}$.

The base of the transistor $Q_{85}$ is connected to the output of the VHF local oscillation circuit $OSC_V$ and the base of the transistor $Q_{86}$, and the collector is connected to the other input of the IF amplifier $AMP_{IF}$.

The emitter of the transistor $Q_{86}$ is connected to the emitter of the transistor $Q_{87}$ and the collector of the transistor $Q_{89}$. The collector of the transistor $Q_{86}$ is connected to one input of the IF amplifier $AMP_{IF}$.

The collector of the transistor $Q_{87}$ is connected via the resistance element $R_{81}$ to the line of the power source voltage $V_{CC}$, and the connection point between the collector and the resistance element $R_{81}$ is connected to the collector of the transistor $Q_{85}$ and further connected to the other input of the IF amplifier $AMP_{IF}$.

The base of the transistor $Q_{88}$ is connected to the input line of the RF signal $RF_V$ of VHF, the emitter is connected to the constant current source $I_{45}$, and the other terminal of the constant current source $I_{45}$ is grounded.

The base of the transistor $Q_{89}$ is connected to the input line of the RF signal $RF_V$ of VHF, the emitter is connected to the constant current source $I_{46}$, and the constant current source $I_{46}$ is grounded.

Also, the resistance element $R_{82}$ is connected between the emitter of the transistor $Q_{88}$ and the emitter of the transistor $Q_{89}$.

This VHF mixing circuit $MIX_V$ mixes the local oscillation frequency signal $S_{LV}$ by the local oscillation circuit $OSC_V$ at the frequency higher than the frequency of the video image carrier wave signal $RF_V$ of the VHF band width of the selected channel by the predetermined frequency, for example, 58.75 MHz, and extracts the intermediate frequency signal $IF_V$, which is the frequency of the difference therebetween, and outputs the same to IF amplifier $AMP_{IF}$ commonly used for UHF and VHF.

The UHF mixing circuit $MIX_U$ is constituted by npn-type transistors $Q_{90}$ to $Q_{95}$, a resistance element $R_{83}$, and constant current sources $I_{47}$ and $I_{48}$.

The base of the transistor $Q_{90}$ is connected to the output of the UHF local oscillation circuit $OSC_U$ and the base of the transistor $Q_{93}$. The emitter of the transistor $Q_{90}$ is connected to the emitter of the transistor $Q_{91}$ and the collector of the transistor $Q_{94}$. The collector of the transistor $Q_{90}$ is connected to the connection point between the collector of the transistor $Q_{84}$ of the VHF mixing circuit $MIX_V$ and the resistance element $R_{80}$, the collector of the transistor $Q_{86}$, and one input of the IF amplifier $AMP_{IF}$.

The base of the transistor $Q_{91}$ is connected to the output of the VHF local oscillation circuit $OSC_U$ and the base of the transistor $Q_{92}$. The collector of the transistor $Q_{91}$ is connected the connection point between the collector of the transistor $Q_{87}$ of the VHF mixing circuit $MIX_V$ and the resistance element $R_{81}$, the collector of the transistor $Q_{85}$, and the other input of the IF amplifier $AMP_{IF}$.

The emitter of the transistor $Q_{92}$ is connected to the emitter of the transistor $Q_{93}$ and the collector of the transistor $Q_{95}$. The collector of the transistor $Q_{92}$ is connected to the connection point between the collector of the transistor $Q_{84}$ of the VHF mixing $MIX_V$ and the resistance element $R_{80}$, the collector of the transistor $Q_{86}$, and one input of the IF amplifier $AMP_{IF}$.

The collector of the transistor $Q_{93}$ is connected to the connection point between the collector of the transistor $Q_{87}$ of the VHF mixing $MIX_V$ and the resistance element $R_{81}$, the collector of the transistor $Q_{85}$, the collector of the transistor $Q_{91}$, and the other input of the IF amplifier $AMP_{IF}$.

The base of the transistor $Q_{94}$ is connected to the input line of the signal $RF_U$, the emitter is connected to the constant current source $I_{47}$, and the other terminal of the constant current source $I_{47}$ is grounded.

The base of the transistor $Q_{95}$ is connected to the input line of the signal $RF_U$, the emitter is connected to the constant current source $I_{48}$, and the other terminal of the constant current source $I_{48}$ is grounded.

Also, the resistance element $R_{83}$ is connected between the emitter of the transistor $Q_{94}$ and the emitter of the transistor $Q_{95}$.

In this way, the UHF mixing circuit $MIX_U$ commonly uses the load resistance elements $R_{80}$ and $R_{81}$ of the VHF mixing circuit $MIX_V$ as the load elements.

This UHF mixing circuit $MIX_U$ mixes the local oscillation frequency signal $S_{LU}$ by the local oscillation circuit $OSC_U$ at the frequency higher than the frequency of the video image carrier wave signal $RF_U$ of the UHF band width of the selected channel by a predetermined frequency, for example, 58.75 MHz, extracts the intermediate frequency signal $IF_U$, which is the frequency of the difference therebetween, and outputs the same to IF amplifier $AMP_{IF}$ commonly used for UHF and VHF.

An explanation will be made next of the operation by the above-described configuration.

At the VHF operation, a UHF/VHF mode changing signal $S_{SW}$ of the low level "0 V" is input to the switching terminal $T_{44}$ by for example an external control system. Alternatively, the switching terminal $T_{44}$ is made open.

By this, the base potential of the switching transistor $Q_{77}$ becomes "0 V", and therefore the switching transistor $Q_{77}$ is retained in the OFF state.

Accordingly, the current generated via the high resistance element $R_{72}$ is supplied to the VHF current source. Along with this, the driving current is supplied to the VHF local oscillation circuit $OSC_V$ and mixing circuit $MIX_V$.

Also, the current generated via the high resistance element $R_{72}$ is applied via the resistance element $R_{73}$ as the predetermined signal voltage to the base of the switching transistor $Q_{76}$.

By this, the switching transistor $Q_{76}$ becomes ON in state, and the UHF system current source connected to the collector thereof becomes OFF. Accordingly, the driving current is not supplied to the UHF mixing circuit $MIX_U$ and local oscillation circuit $OSC_U$.

Accordingly, at the VHF operation mode, where a VHF broadcast is received, only the VHF local oscillation circuit $OSC_V$ and mixing circuit $MIX_V$ are driven, a local oscillation frequency signal $S_{LV}$ having a frequency higher than the frequency of the video image carrier wave signal $RF_V$ of the channel selected from the VHF local oscillation circuit $OSC_V$ by the predetermined frequency is output from the output buffer $BUF_V$ to the mixing circuit $MIX_V$.

By this, the mixing circuit $MIX_V$ mixes the video image carrier wave signal $RF_V$ of the selected channel and the local oscillation frequency signal $S_{LV}$, extracts the intermediate frequency signal $IF_V$, which is the frequency of the differential thereof, and output this to the IF amplifier $AMP_{IF}$ commonly used for UHF and VHF.

At the IF amplifier $AMP_{IF}$, the predetermined amplification function is carried out, whereby the IF output of VHF is obtained.

Contrary to this, at the UHF operation, a UHF/VHF mode changing signal $S_{SW}$ of a high level of "9 V", the same level as that of the power source voltage $V_{CC}$, is applied to the switching terminal $T_{SW}$ by for example the external control system.

By this, the base potential of the switching transistor $Q_{77}$ becomes the high level, and therefore the switching transistor $Q_{77}$ is retained in the ON state.

Accordingly, the current generated via the high resistance element $R_{72}$ is passed through the switching transistor $Q_{77}$, not supplied to the VHF current source, and the collector side is retained at "0 V" at the switching transistor $Q_{72}$. Along with this, the driving current is not supplied to the VHF local oscillation circuit $OSC_V$, output buffer $BUF_V$, and mixing circuit $MIX_V$.

Also, since the collector side of the switching transistor $Q_{77}$ is retained at "0 V", the base potential of the switching transistor $Q_{76}$ becomes "0 V", and therefore the switching transistor $Q_{76}$ is retained in the OFF state.

By this, the UHF system current source connected to the collector of the switching transistor $Q_{76}$ is turned ON. Accordingly, the driving current is supplied to the UHF mixing circuit $MIX_U$ and local oscillation circuit $OSC_U$.

Accordingly, at the UHF operation mode, when a UHF broadcast is received, only the UHF local oscillation circuit $OSC_U$ and mixing circuit $MIX_U$ are driven, the local oscillation frequency signal $S_{LU}$ at the frequency higher than the frequency of the video image carrier wave signal $RF_U$ Of the selected channel by a predetermined frequency is output from the oscillation transistors $Q_{78}$ and $Q_{79}$ with collectors which are connected to the load resistance elements $R_{65}$ and $R_{66}$ of the VHF output buffer $BUF_V$ to the mixing circuit $MIX_U$.

At this time, as mentioned above, the driving current is not supplied to the VHF local oscillation circuit $OSC_V$ and output buffer $BUF_V$, and therefore no influence is exerted upon the oscillation operation of the UHF local oscillation circuit $OS_U$.

By this, the mixing circuit $MIX_U$ mixes the video image carrier wave signal $RF_U$ of the selected channel and the local oscillation frequency signal $S_{LU}$, extracts the intermediate frequency signal $IF_U$, which is the frequency of the difference therebetween, and outputs this to the IF amplifier $AMP_{IF}$ commonly used for the UHF and VHF.

At the IF amplifier $AMP_{IF}$, the predetermined amplification function is carried out, whereby the IF output of UHF is obtained.

Also, irrespective of the UHF/VHF operation, an oscillation signal in accordance with the operation mode is output from the output terminals $O_{UT31}$ and $O_{UT32}$, which are middle points of connection between the collectors of the transistors $Q_{73}$ and $Q_{74}$, of the output buffer $BUF_V$ of the VHF local oscillation circuit $OSC_V$ and the load resistance elements $R_{65}$ and $R_{66}$ to the PLL circuit.

As explained above, according to the present embodiment, as the load element of the oscillation transistors $Q_{79}$ and $Q_{81}$ in the UHF local oscillation circuit $OSC_U$, the configuration is made so that the load resistance elements $R_{64}$ to $R_{66}$ of the output block $BUF_V$ of the VHF local oscillation circuit $OSC_V$ which are not simultaneously driven are commonly used and, also the output terminals $O_{UT31}$ and $O_{UT32}$ to the PLL circuit are commonly used. Therefore, a reduction of the number of elements can be achieved and the number of the outputs to the PLL circuit, which basically has one input, becomes one, it becomes unnecessary to provide a switching circuit, and so on. Therefore, there is an advantage such that the connection to the PLL circuit becomes easy, and the increase of the number of element can be suppressed.

Also, since the configuration is made so that the circuits are not simultaneously driven and so that the load elements of the VHF mixing circuit $MIX_V$ and UHF mixing circuit $MIX_U$ which output the intermediate frequency signals $IF_V$ and $IF_U$ obtained as a result of mixing to the commonly used IF amplifier $AMP_{IF}$ are commonly used as the load resistance elements $RM_{80}$ and $RM_{81}$ of the VHF mixing circuit $MIX_V$, there are advantages such that the reduction of the number of elements can be achieved and also the connection to the IF amplifier $AMP_{IF}$ becomes easy.

Accordingly, according to the circuit of the present embodiment, a reduction of cost and reduction of size can be achieved.

As explained above, according to the present invention, an oscillator and a mixer which can achieve the reduction of the number of elements and can achieve a simplification of the circuit, reduction of cost, and reduction of size can be realized.

An explanation will be made next of a seventh embodiment of the present invention.

Figure 11:
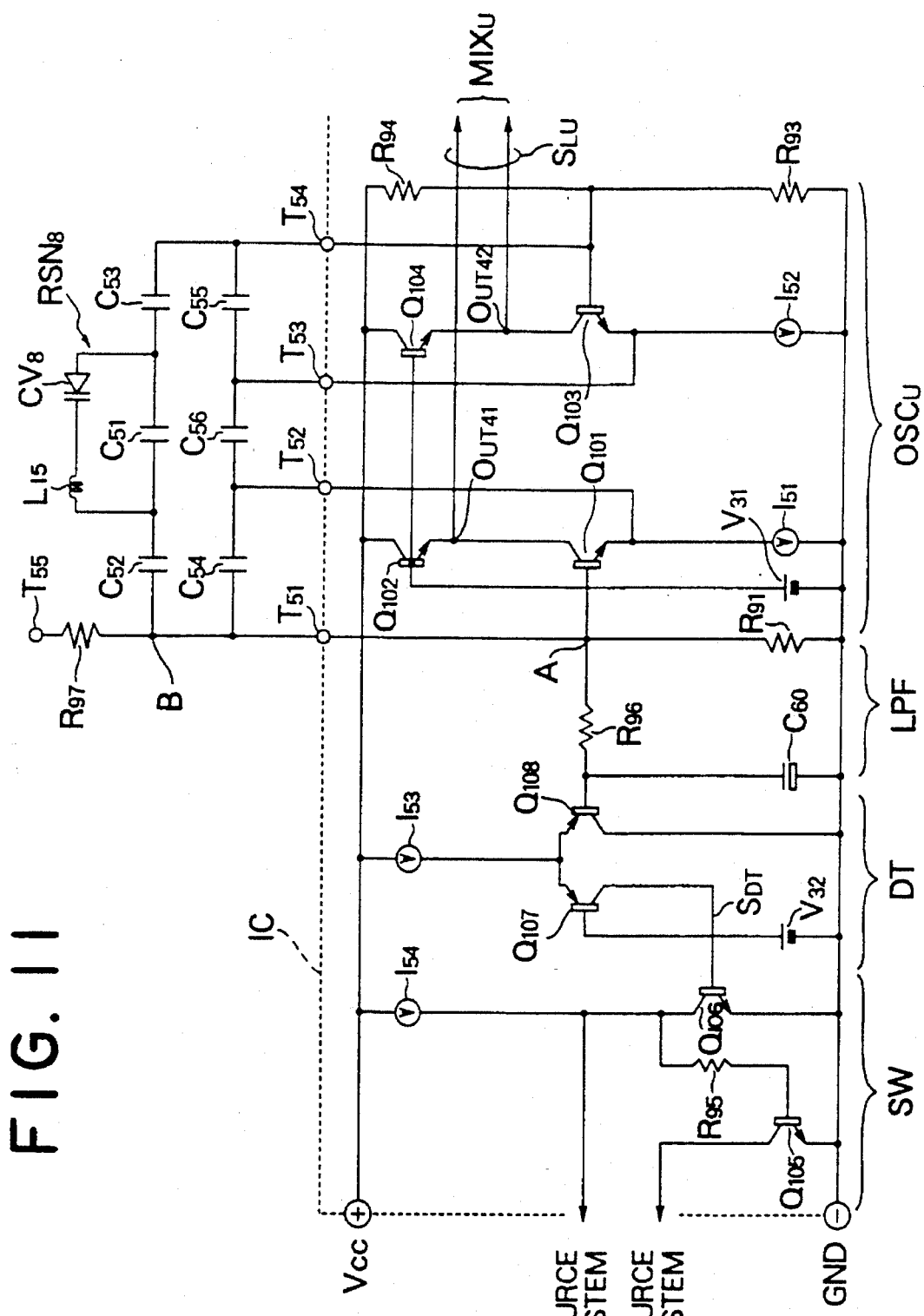
FIG. 11 shows a diagram of a switching circuit of the oscillator according to an eighth embodiment of the present invention.

FIG. 11 is a circuit diagram showing the seventh embodiment of an integrated oscillation circuit portion of a television tuner according to the present invention.

Namely, IC denotes an integrated frequency conversion circuit; $OSC_U$ denotes a UHF local oscillation circuit; SW denotes a switching circuit; LPF denotes a low pass filter; DT denotes a detection circuit; $T_{51}$ to $T_{54}$ denote input/output terminals used as the connection terminals with the external circuit etc.; $RSN_8$ denotes an external variable resonance circuit; $R_{97}$ an externally attached resistance element; $C_{52}$ and $C_{53}$ denote DC cutting capacitors; $C_{54}$ and $C_{55}$ denote capacitors for the positive feedback; and $C_{56}$ a connection capacitor, respectively.

Among these circuits, the UHF local oscillation circuit $OSC_U$, the low pass filter LPF, the detection circuit DT, and the switching circuit SW are integrated, and the UHF local oscillation circuit $OSC_U$ is connected via four input/output terminals $T_{51}$ to $T_{54}$ to the external variable resonance circuit $RSN_8$ and connected via the input/output terminal $T_{51}$ to the input end $T_{55}$ of the UHF/VHF mode changing signal $S_{SW}$.

The local oscillation circuit $OSC_U$ is constituted by a first Colpitz oscillation circuit, consisting of an npn-type oscillation transistor $Q_{101}$, and an npn-type oscillation transistor $Q_{102}$ for the load thereof, and a second Colpitz oscillation circuit consisting of an npn-type oscillation transistor $Q_{103}$, an npn-type transistor $Q_{104}$ for the load thereof, resistance elements $R_{91}$, $R_{93}$, and $R_{94}$, a biasing constant voltage source $V_{31}$ of the load transistors $Q_{102}$ and $Q_{104}$ and constant current sources $I_{51}$ and $I_{52}$.

The base of the oscillation transistor $Q_{101}$ is connected to the input/output $T_{51}$ and connected via the resistance element $R_{91}$ to the ground line GND, and the connection point between them is connected to the input of the low pass filter LPF.

The emitter of the oscillation transistor $Q_{101}$ is connected to the input/output $T_{52}$ and connected to the constant current source $I_{51}$, and the constant current source $I_{51}$ is connected to the ground line GND.

The collector of the oscillation transistor $Q_{101}$ is connected to the emitter of the transistor $Q_{102}$ for the load, and the output terminal $O_{UT41}$ of the first Colpitz oscillation circuit is constituted by the connection point between them. This output terminal $O_{UT41}$ is connected to the not illustrated integrated mixing circuit $MIX_U$.

The base of the load transistor $Q_{102}$ is connected to the constant voltage source $V_{31}$, and the collector is connected to the line of the power source voltage $V_{CC}$.

The base of the oscillation transistor $Q_{103}$ is connected to the input/output terminal $T_{54}$ and connected to the connection point between the resistance elements $R_{93}$ and $R_{94}$. The emitter of the oscillation transistor $Q_{103}$ is connected to the input/output terminal $T_{53}$ and connected to the constant current source $I_{52}$, and the constant current source $I_{52}$ is connected to the ground line GND. The collector of the oscillation transistor $Q_{103}$ is connected to the emitter of the load transistor $Q_{104}$, and the output terminal $O_{UT42}$ of the second Colpitz oscillation circuit is constituted by the connection point between them. This output terminal $O_{UT42}$ is connected to the not illustrated integrated mixing circuit $MIX_U$.

The base of the load transistor $Q_{104}$ is connected to the constant voltage source $V_{31}$, and the collector is connected to the line of the power source voltage $V_{CC}$.

The external variable resonance circuit $RSN_8$ is constituted by connecting the capacitor $C_{51}$ in parallel to the serial circuit of the variable capacitance diode $CV_8$ and the coil $L_{15}$.

The connection point between the coil $L_{15}$ of the external variable resonance circuit $RSN_8$ and the capacitor $C_{51}$ is connected via the DC cutting capacitor $C_{52}$ to the input/output terminal $T_{51}$ (base of the oscillation transistor $Q_{101}$), and the connection point between the anode of the variable capacitance diode $CV_8$ and the capacitor $C_{51}$ is connected via the DC cutting capacitor $C_{53}$ to the input/output terminal $T_{54}$ (the base of the oscillation transistor $Q_{103}$).

Also, the positive feedback capacitor $C_{54}$ is connected between the connection point between the capacitor $C_{52}$ and input/output terminal $T_{51}$ and the input/output terminal $T_{52}$, and the positive feedback capacitor $C_{55}$ is connected between the connection point between the capacitor $C_{53}$ and input/output terminal $T_{54}$ and the input/output terminal $T_{53}$.

Further, a coupling capacitor $C_{56}$ is connected between the connection point between the capacitor $C_{54}$ and the input/output terminal $T_{52}$ and the connection point between the capacitor $C_{55}$ and the input/output terminal $T_{53}$ (between the emitter of the oscillation transistor $Q_{101}$ and the emitter of the oscillation transistor $Q_{103}$).

The local oscillation circuit $OSC_U$ is subjected to a positive feedback by the externally attached capacitors $C_{54}$ and $C_{55}$ connected between the base and emitter of the oscillation transistors $Q_{101}$ and $Q_{103}$ via the input/output terminals $T_{51}$, $T_{52}$, $T_{53}$, and $T_{54}$. It oscillates by the resonance frequency of the external variable resonance circuit $RSN_8$ connected to respective bases of the oscillation transistors $Q_{101}$ and $Q_{103}$ and outputs the local oscillation frequency signal $S_{LU}$ at the predetermined frequency from the output terminals $O_{UT41}$ and $O_{UT42}$ to the UHF mixing circuit $MIX_U$.

Note that, the oscillation transistors $Q_{101}$ and $Q_{103}$ constituting the first and second Colpitz oscillation circuits perform oscillation operations of reverse phases to each other since the respective bases are mutually connected via the external variable resonance circuit $RSN_8$.

Accordingly, local oscillation frequency signals $S_{LU}$ having reverse phases to each other are output from the output terminals $O_{UT41}$ and $O_{UT42}$.

Also, the externally attached resistance element $R_{97}$ is connected between the middle point B of connection between the input/output terminal $T_{51}$ and DC cutting capacitor $C_{52}$ and the input/output terminal TSW of the UHF/VHF mode changing signal $S_{SW}$.

Accordingly, in the integrated frequency conversion circuit IC, the connection terminal between the base of the oscillation transistor $Q_{101}$ and the external variable resonance circuit $RSN_8$ and the input terminal of the UHF/VHF mode changing signal $S_{SW}$ make common use of the one input/output terminal $T_{51}$.

Note that, the resistance value of the externally attached resistance element $R_{97}$ is set to the same value as that of the internal resistance element $R_{94}$.

In the local oscillation circuit $OSC_U$, a voltage obtained by dividing the voltage of the UHF/VHF mode changing signal $S_{SW}$, the level of which is changed by switching in accordance with the UHF/VHF mode, is applied as the biasing voltage to the base as the biasing terminal of the oscillation transistor $Q_{101}$ by the internal resistance element $R_{91}$ and the externally attached resistance element $R_{97}$.

Also, the internal resistance elements $R_{93}$ and $R_{94}$ are connected in series between the ground line GND and the line of the power source voltage $V_{CC}$, and the voltage obtained by dividing the voltage of the power source voltage $V_{CC}$ by the two resistance elements $R_{93}$ and $R_{94}$ is applied as the biasing voltage to the base as the biasing terminal of the oscillation transistor $Q_{103}$.

The low pass filter LPF is constituted by the resistance element $R_{96}$ and the capacitor $C_{60}$, attenuated the oscillation signal between the oscillation signal appearing at the connection point A via the input/output terminal $T_{51}$ and UHF/VHF mode changing signal $S_{SW}$, to obtain only the DC component, and outputs the same to the detection circuit DT.

In this low pass filter LPF, one end of the resistance element $R_{96}$ constitutes the input end, which is connected to the oscillation transistor $Q_{101}$ and the connection point between the input/output terminal $T_{51}$ and the resistance element $R_{91}$, the other end of the resistance element $R_{96}$ is connected to one electrode of the capacitor $C_{60}$, the other electrode of the capacitor $C_{60}$ is connected to the ground line GND, and the connection point between the other end of the resistance element $R_{96}$ and one electrode of the capacitor $C_{60}$ constitutes the output end, which is connected to the input of the detection circuit DT.

The detection circuit DT is constituted by a differential operation type comparator comprising the pnp-type transistors $Q_{108}$ and $Q_{107}$, the constant voltage source $V_{32}$, and the constant current source $I_{53}$, detects the level of the UHF/VHF mode changing signal $S_{SW}$ input with a level in accordance with the operation mode, and outputs the detection signal $S_{DT}$ of a level in accordance with the detection level to the switching circuit SW.

In this detection circuit DT, the base of the pnp-type transistor $Q_{108}$ constitutes the input end, which is connected to the output end comprising the connection point between the other end of the resistance element $R_{96}$ of the low pass filter LPF and one electrode of the capacitor $C_{60}$. The emitter of the pnp-type transistor $Q_{108}$ is connected to the constant current source $I_{53}$, and the collector is connected to the ground line GND. Also, the constant current source $I_{53}$ is connected to the power source voltage $V_{CC}$.

The base of the pnp-type transistor $Q_{107}$ is connected to the constant voltage source $V_{32}$, the emitter is connected to the constant current source $I_{53}$, and the collector constitutes the output end of the detection signal $S_{DT}$, which is connected to the input of the switching circuit SW.

Note that, the constant voltage source $V_{32}$ determines the threshold level of the UHF/VHF operation. The level thereof is set up to the value at the intermediate level between the base potential of the oscillation transistor $Q_{101}$ determined by the division of resistor of the internal resistance element $R_{91}$ and the externally attached resistance element $R_{97}$ and "0 V".

The switching circuit SW is constituted by the switching operation npn-type transistors $Q_{105}$ and $Q_{106}$, the resistance element $R_{95}$, and the constant current source $I_{54}$ and complementarily turns ON and OFF the UHF system current source and VHF system current source, which are not illustrated, in accordance with the input level of the detection signal $S_{DT}$.

In this switching circuit SW, the base of the switching transistor $Q_{105}$ is connected via the resistance element $R_{95}$ to the collector of the switching transistor $Q_{106}$, the emitter is connected to the ground line GND, and the collector is connected to the not illustrated UHF system current source.

The base of the switching transistor $Q_{106}$ constitutes the input end, which is connected to the collector of the pnp-type transistor $Q_{107}$, which is the output end of the detection circuit DT. The emitter of the switching transistor $Q_{106}$ is connected to the ground line GND, the connection point between the collector and the resistance element $R_{95}$ is connected to the constant current source $I_{54}$, and the constant current source $I_{54}$ is connected to the line of the power source voltage $V_{CC}$. Also, the connection point between the collector and the resistance element $R_{95}$ and the connection point with the constant current source $I_{54}$ is connected to the not illustrated VHF system current source.

An explanation will be made next of the operation by the above-described configuration. Note that, here, an explanation will be made of the mode changing operation between UHF and VHF, and an explanation for the oscillation operation of the local oscillation circuit $OSC_U$ will be omitted.

At the VHF operation, the UHF/VHF mode changing signal $S_{SW}$ of the low level "0 V" is input by for example a not illustrated external control system to the input end $T_{55}$. Alternatively, the input end $T_{55}$ is made open.

The UHF/VHF mode changing signal $S_{SW}$ input to the input end $T_{55}$ is input from the input/output terminal $T_{51}$ to the integrated circuit IC via the externally attached resistance element $R_{97}$, input to the base of the oscillation transistor $Q_{101}$ through the connection point A, and input to the low pass filter LPF. At this time, the base of the transistor $Q_{101}$ becomes "0 V".

At the low pass filter LPF, the DC component is obtained, and that DC component is input to the base of the pnp-type transistor $Q_{108}$ of the detection circuit DT. At this time, the UHF/VHF mode changing signal $S_{SW}$ is "0 V", and therefore also the input DC component is "0 V".

Accordingly, the base potential of the pnp-type transistor $Q_{108}$ becomes lower than the base potential of the pnp-type transistor $Q_{107}$, the pnp-type transistor $Q_{108}$ is retained in the ON state, and the pnp-type transistor $Q_{107}$ is retained in the OFF state.

As a result, the current of the constant current source $I_{53}$ is all passed to the pnp-type transistor $Q_{108}$, and therefore the collector of the pnp-type transistor $Q_{107}$ becomes "0 V". By this, the detection signal $S_{DT}$ of "0 V" (low level) is input to the base of the switching transistor $Q_{106}$ of the switching circuit SW.

Along with this, the base potential of the switching transistor $Q_{106}$ becomes "0 V", and therefore the switching transistor $Q_{106}$ is retained in the OFF state.

Accordingly, the current by the constant current source $I_{54}$ is supplied to the VHF current source. Along with this, the driving current is supplied to the VHF mixing circuit $MIX_V$ and local oscillation circuit $OSC_V$.

Also, the current by the constant current source $I_{54}$ is applied to the base of the switching transistor $Q_{105}$ as the predetermined signal voltage via the resistance element $R_{95}$.

By this, the switching transistor $Q_{105}$ is retained in the ON state, and as a result, the UHF system current source connected to the collector becomes OFF.

Accordingly, the driving current is not supplied to the UHF mixing circuit $MIX_U$ and local oscillation circuit $OSC_U$.

Contrary to this, at the UHF operation, the UHF/VHF mode changing signal $S_{SW}$ of the high level "9 V", the same level as that of the power source voltage $V_{CC}$, is input to the input end by for example a not illustrated external control system.

The UHF/VHF mode changing signal $S_{SW}$ input to the input end $T_{55}$ is input from the input/output terminal $T_{51}$ to the integrated circuit IC via the externally attached resistance element $R_{97}$, input to the base of the oscillation transistor $Q_{101}$ via the connection point A and, at the same time, input to the low pass filter LPF. At this time, the base of the oscillation transistor $Q_{101}$ becomes the potential obtained by dividing "9 V" by the internal resistance element $R_{91}$ and the externally attached resistance element $R_{97}$. The potential at the point A at this time is defined as "$V_A$".

Also, the oscillation signal fed back as a positive feedback by the externally attached capacitor $C_{54}$ appears at the connection point A via the input/output terminal $T_{51}$ and is input to the low pass filter LPF.

At the low pass filter LPF, the oscillation signal is attenuated, so that the DC component is obtained, and that DC component is input to the base of the pnp-type transistor $Q_{108}$ of the detection circuit DT. $V_{32}$ is determined at the potential at an intermediate level between "$V_A$" and "0 V", whereby the base potential of the of the pnp-type transistor $Q_{107}$ is raised over the base potential of the pnp-type transistor $Q_{107}$, the pnp-type transistor $Q_{107}$ is retained in the OFF state, and the pnp-type transistor $Q_{107}$ is retained in the ON state.

As a result, the current of the constant current source $I_{53}$ is all passed through the pnp-type transistor $Q_{107}$, and therefore the collector of the pnp-type transistor $Q_{107}$ becomes the high potential (high level). By this, the high level detection signal $S_{dt}$ is input to the base of the switching transistor $Q_{106}$ of the switching circuit SW.

By this, the base potential of the switching transistor $Q_{106}$ becomes the high level, and therefore the switching transistor $Q_{106}$ is retained in the ON state.

Accordingly, the current by the constant current source $I_{54}$ flows through the switching transistor $Q_{106}$, not supplied to the VHF current source, and the collector side of the switching transistor $Q_{106}$ is retained at "0 V". Along with this, the driving current is not supplied to the VHF mixing circuit $MIX_V$ and local oscillation circuit $OSC_V$.

Also, since the collector side is retained at "0 V" at the switching transistor $Q_{106}$, the base potential of the switching transistor $Q_{105}$ becomes "0 V", and therefore the switching transistor $Q_{105}$ is retained in the OFF state.

By this, the UHF system current source connected to the collector of the switching transistor $Q_{105}$ is turned ON. Accordingly, the driving current is supplied to the UHF mixing circuit $MIX_U$ and local oscillation circuit $OSC_U$.

As explained above, according to the present embodiment, the configuration is made so that, in the integrated frequency conversion circuit IC constituted by forming the UHF mixing circuit $MIX_U$ and local oscillation circuit $OSC_U$, VHF mixing circuit $MIX_V$ and local oscillation circuit $OSC_V$, and the IF amplifier which amplifies the intermediate frequency signal by the UHF mixing circuit $MIX_U$ and the intermediate frequency signal by the VHF mixing circuit $MIX_V$ into a single chip, for the terminal for changing between the UHF and VHF modes, common use is made of the input/output terminal $T_{51}$ for the connection with the external variable resonance circuit RSN, of the UHF local oscillation circuit $OSC_U$, the level of the UHF/VHF mode changing signal $S_{SW}$ input at the level in accordance with the mode is detected at the detection circuit DT, the detection signal $S_{DT}$ of the level in accordance with the detection level is input to the switching circuit SW, and the UHF system current source and the VHF system current source are complementarily turned ON and OFF, and therefore a reduction of the number of terminals can be achieved.

As a result, there are the advantages in that it becomes possible to accommodate the integrated frequency conversion circuit IC in a small package, the reduction of the parasitic oscillation and lowering of gain can be achieved, and a reduction of size of the tuner etc. and a reduction of the cost can be achieved.

Note that, in the circuit of FIG. 11, the resistance element $R_{94}$ and the resistance element $R_{97}$ for the voltage division are an internal resistor and external resistor, and accordingly there occurs a difference between the resistance values, and a slight potential difference is sometimes produced at the base bias between the oscillation transistors $Q_{101}$ and $Q_{103}$.

However, the current and the collector potential are set under the same conditions inside the IC, and also the DC component of the external variable resonance circuit $RSN_8$ is cut by the capacitance connection, and therefore this has no influence upon the differential oscillation characteristic of the local oscillation circuit $OSC_U$.

As explained above, according to the present invention, a reduction of the number of terminals can be achieved, and as a result, it becomes possible to accommodate the integrated circuit in the small package, a reduction of the parasitic oscillation and lowering of gain can be achieved, and a reduction of size of the applied tuner and a reduction of cost can be achieved.

What is claimed is:

1. An integrated oscillation circuit comprising:

a connection terminal connected to an external resonance circuit and an input line of a mode switching signal which is set at a different level in response to an operation mode;

an oscillation element, a bias terminal of which is connected to said connection terminal;

a detection circuit detecting the level of said mode switching signal applied to said bias terminal of said oscillation element; and a switching circuit turning on or off a power source for driving said oscillation element in response to said level detected at said detection circuit.

2. An integrated oscillation circuit according to claim 1, further comprising a filter provided between said bias terminal and said detection circuit, said filter attenuating said mode switching signal to provide a DC component.

3. An integrated oscillation circuit according to claim 1, wherein said oscillation element comprises an npn-type transistor, and wherein said detection circuit comprises a differential operation type comparator including a pair of pnp-type transistors having emitters which are connected to current sources, a base of one of said pnp-type transistors being applied with said mode switching signal, and a base of other of said pnp-type transistors being applied with a signal having a predetermined set level.

4. An integrated oscillation circuit comprising:

a connection terminal connected to an external resonance circuit and an input line of a mode switching signal which is set at a different level in response to an operation mode;

an oscillation element, a bias terminal of which is connected to said connection terminal;

a detection circuit detecting the level of said mode switching signal applied to said bias terminal of said oscillation element;

a switching circuit turning on or off a power source for driving said oscillation element in response to said level detected at said detection circuit; and a filter provided between said bias terminal and said detection circuit, said filter attenuating said mode switching signal to provide a DC component.

5. An integrated oscillation circuit according to claim 4, wherein said oscillation element comprises an npn-type transistor, and wherein said detection circuit comprises a differential operation type comparator including a pair of pnp-type transistors having emitters which are connected to current sources, a base of one of said pnp-type transistors being applied with said mode switching signal, and a base of other of said pnp-type transistors being applied with a signal having a predetermined set level.

6. An oscillator comprising:

a first oscillating circuit including a first oscillation transistor pair connected to a first resonance circuit, and a buffer transistor pair connected to said first oscillation transistor pair and having a first load element for outputting a first oscillation signal having a first frequency; and a second oscillating circuit including a second oscillation transistor pair connected to a second resonance circuit and said first load element and outputting a second oscillation signal having a second frequency.

7. An oscillator according to claim 6, wherein said first oscillating circuit and said second oscillating circuit are complementary turned on and off.

* * * * *